(12) United States Patent
Kim et al.

(10) Patent No.: US 10,847,468 B2
(45) Date of Patent: Nov. 24, 2020

(54) SEMICONDUCTOR PACKAGE INCLUDING INTERPOSER

(71) Applicant: Samsung Electronics Co., Ltd., Suwon-si (KR)

(72) Inventors: Jong-youn Kim, Seoul (KR); Seok-hyun Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/299,340

(22) Filed: Mar. 12, 2019

(65) Prior Publication Data

US 2020/0043853 A1    Feb. 6, 2020

(30) Foreign Application Priority Data

Jul. 31, 2018 (KR) .................... 10-2018-0089508

(51) Int. Cl.
*H01L 23/538*    (2006.01)
*H01L 21/48*    (2006.01)
(Continued)

(52) U.S. Cl.
CPC ........ *H01L 23/5385* (2013.01); *H01L 21/486* (2013.01); *H01L 21/4853* (2013.01);
(Continued)

(58) Field of Classification Search
CPC ............. H01L 23/5385; H01L 23/3675; H01L 23/5384; H01L 23/5386; H01L 21/4853;
(Continued)

(56) References Cited

U.S. PATENT DOCUMENTS 8,901,748 B2   12/2014   Manusharow et al.
9,337,120 B2   5/2016   Li et al.
(Continued)

FOREIGN PATENT DOCUMENTS

WO    WO-2016/179159 A1    11/2016

OTHER PUBLICATIONS

Extended European Search Report dated Sep. 11, 2019, issued in corresponding European Appln. No. 19160953.6.

*Primary Examiner* — Tu-Tu V Ho
(74) *Attorney, Agent, or Firm* — Harness, Dickey & Pierce, P.L.C.

(57) ABSTRACT

Provided is a semiconductor package including an interposer. The semiconductor package includes: a package base substrate; a lower redistribution line structure disposed on the package base substrate and including a plurality of lower redistribution line patterns; at least one interposer including a plurality of first connection pillars spaced apart from each other on the lower redistribution line structure and connected respectively to portions of the plurality of lower redistribution line patterns, and a plurality of connection wiring patterns; an upper redistribution line structure including a plurality of upper redistribution line patterns connected respectively to the plurality of first connection pillars and the plurality of connection wiring patterns, on the plurality of first connection pillars and the at least one interposer; and at least two semiconductor chips adhered on the upper redistribution line structure while being spaced apart from each other.

20 Claims, 29 Drawing Sheets

(51) Int. Cl.
*H01L 21/56* (2006.01)
*H01L 21/683* (2006.01)
*H01L 23/367* (2006.01)
*H01L 23/00* (2006.01)
*H01L 25/065* (2006.01)
*H01L 25/18* (2006.01)

(52) U.S. Cl.
CPC ........ *H01L 21/4857* (2013.01); *H01L 21/565* (2013.01); *H01L 21/568* (2013.01); *H01L 21/6835* (2013.01); *H01L 23/3675* (2013.01); *H01L 23/5384* (2013.01); *H01L 23/5386* (2013.01); *H01L 24/16* (2013.01); *H01L 24/81* (2013.01); *H01L 25/0655* (2013.01); *H01L 24/32* (2013.01); *H01L 24/73* (2013.01); *H01L 25/18* (2013.01); *H01L 2221/68345* (2013.01); *H01L 2221/68359* (2013.01); *H01L 2224/16227* (2013.01); *H01L 2224/32225* (2013.01); *H01L 2224/73204* (2013.01); *H01L 2224/81005* (2013.01)

(58) Field of Classification Search
CPC . H01L 21/4857; H01L 21/486; H01L 21/565; H01L 21/568; H01L 21/6835; H01L 24/16; H01L 24/81; H01L 24/32; H01L 24/73; H01L 25/0655; H01L 25/18; H01L 2221/68345; H01L 2221/68359; H01L 2224/16227; H01L 2224/32225; H01L 2224/73204; H01L 2224/81005
USPC .......................................................... 257/668
See application file for complete search history.

(56) References Cited

U.S. PATENT DOCUMENTS

| | | |
|---|---|---|
| 9,406,361 B2 | 8/2016 | Ryoo et al. |
| 2015/0115433 A1 | 4/2015 | Lin et al. |
| 2016/0056102 A1 | 2/2016 | Konchady et al. |
| 2016/0240497 A1 | 8/2016 | Chen et al. |
| 2016/0307870 A1 | 10/2016 | Kelly et al. |
| 2017/0011993 A1 | 1/2017 | Zhao et al. |
| 2017/0062383 A1 | 3/2017 | Yee et al. |
| 2017/0287838 A1 | 10/2017 | Pietambaram et al. |
| 2017/0365565 A1 | 12/2017 | Zhao et al. |
| 2018/0005945 A1 | 1/2018 | Pietambaram et al. |
| 2018/0053723 A1 | 2/2018 | Hu |
| 2018/0102311 A1 | 4/2018 | Shih |
| 2019/0131273 A1* | 5/2019 | Chen .................. H01L 23/5389 |

* cited by examiner

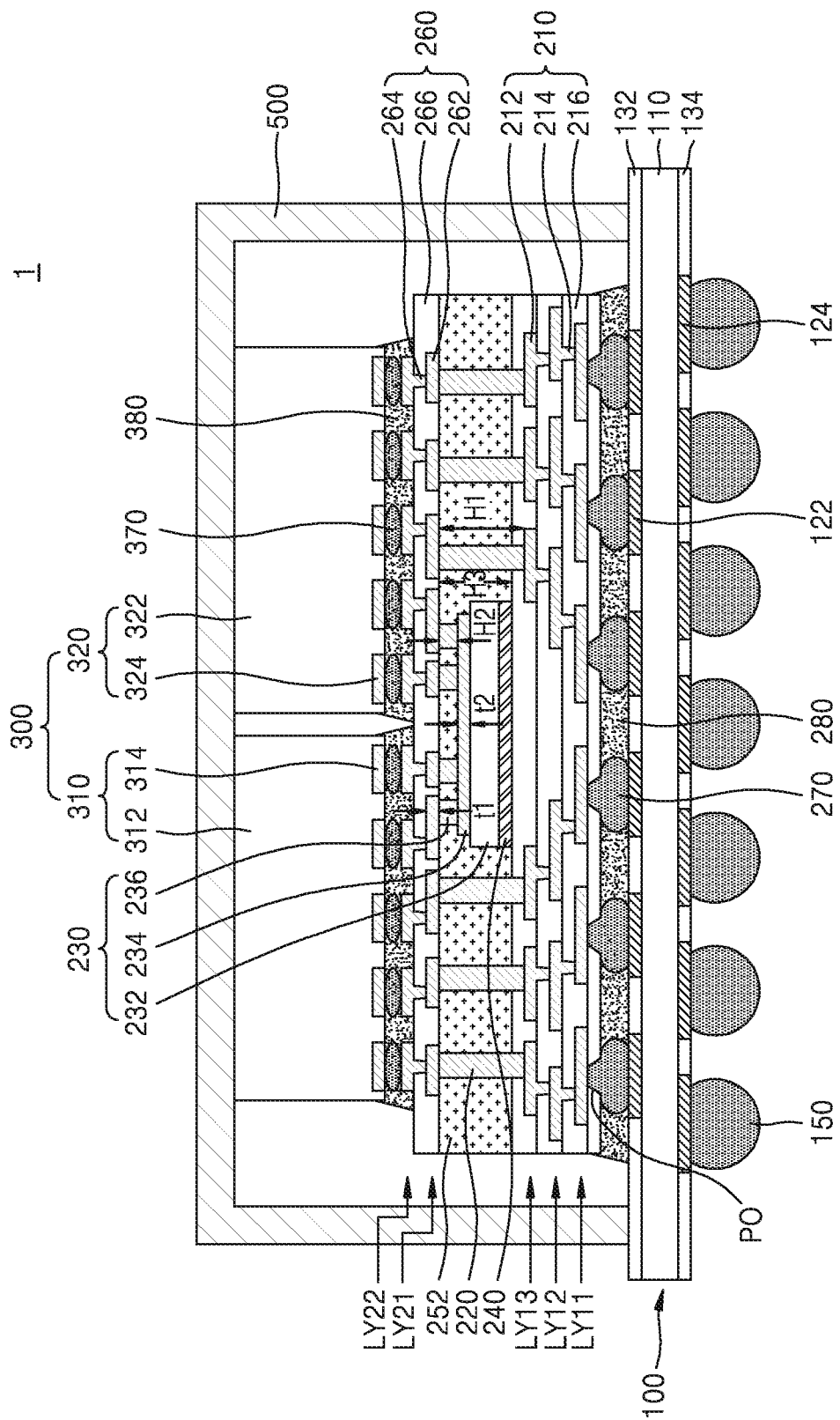

US 10,847,468 B2

SEMICONDUCTOR PACKAGE INCLUDING INTERPOSER

CROSS-REFERENCE TO RELATED APPLICATION

This application claims the benefit of Korean Patent Application No. 10-2018-0089508, filed on Jul. 31, 2018, in the Korean Intellectual Property Office, the disclosure of which is incorporated herein in its entirety by reference.

BACKGROUND

The inventive concepts relate to a semiconductor package including a plurality of semiconductor chips, and more particularly, to a semiconductor package including an interposer for interconnecting the plurality of semiconductor chips to each other.

According to the development of electronic industries and user's demands, electronic devices have been further miniaturized, multi-functionalized, and/or largely capacitated, and accordingly, a semiconductor package including a plurality of semiconductor chips is required.

When each of the plurality of semiconductor chips included in the semiconductor package is highly integrated, a printed circuit board may be unable to accommodate such a high degree of integration. In this regard, a semiconductor package interconnecting the plurality of semiconductor chips via an interposer has been developed.

SUMMARY

The inventive concepts provide a semiconductor package including an interposer that may be implemented at lower cost.

According to an aspect of the inventive concepts, there is provided a semiconductor package including a lower redistribution line structure including a plurality of lower insulating layers and a plurality of lower redistribution line patterns respectively on at least one of top surfaces and bottom surfaces of the plurality of lower insulating layers; a plurality of first connection pillars on at least portions of the plurality of lower redistribution line patterns, respectively; an interposer apart from the plurality of first connection pillars on the lower redistribution line structure and including an interposer substrate, a plurality of connection wiring patterns on a top surface of the interposer substrate, and a plurality of second connection pillars on at least portions of the plurality of connection wiring patterns, respectively; an upper redistribution line structure including at least one upper insulating layer and a plurality of upper redistribution line patterns on a top surface or a bottom surface of the at least one upper insulating layer and connected to the plurality of first connection pillars and the plurality of second connection pillars, respectively; and at least two semiconductor chips on the upper redistribution line structure, electrically connected to the plurality of upper redistribution line patterns, and apart from each other.

According to another aspect of the inventive concepts, there is provided a semiconductor package including: a package base substrate; a lower redistribution line structure on the package base substrate and including a plurality of lower redistribution line patterns; at least one interposer including a plurality of first connection pillars apart from each other on the lower redistribution line structure and connected to portions of the plurality of lower redistribution line patterns, and a plurality of connection wiring patterns, respectively; an upper redistribution line structure including a plurality of upper redistribution line patterns connected to the plurality of first connection pillars and the plurality of connection wiring patterns, respectively, on the plurality of first connection pillars and the at least one interposer; and at least two semiconductor chips on the upper redistribution line structure apart from each other and electrically connected to the plurality of upper redistribution line patterns.

According to another aspect of the inventive concepts, there is provided a semiconductor package including: a lower redistribution line structure including a plurality of lower redistribution line patterns; an interposer on the lower redistribution line structure, the interposer including a plurality of first connection pillars connected to the plurality of lower redistribution line patterns, an interposer substrate, a plurality of connection wiring patterns on the interposer substrate, and a plurality of second connection pillars on the plurality of connection wiring patterns; an upper redistribution line structure including a plurality of upper redistribution line patterns electrically connected to the plurality of first connection pillars and the plurality of second connection pillars, on the plurality of first connection pillars and the interposer; and at least two semiconductor chips on the upper redistribution line structure and electrically connected to the plurality of upper redistribution line patterns, wherein a portion of the plurality of upper redistribution line patterns and a portion of the plurality of lower redistribution line patterns extend beyond a footprint occupied by the at least two semiconductor chips in a horizontal direction.

BRIEF DESCRIPTION OF THE DRAWINGS

Embodiments of the inventive concepts will be more clearly understood from the following detailed description taken in conjunction with the accompanying drawings in which:

FIG. 1A is a cross-sectional view of a semiconductor package according to an embodiment;

DETAILED DESCRIPTION OF EMBODIMENTS

Figure 1B:
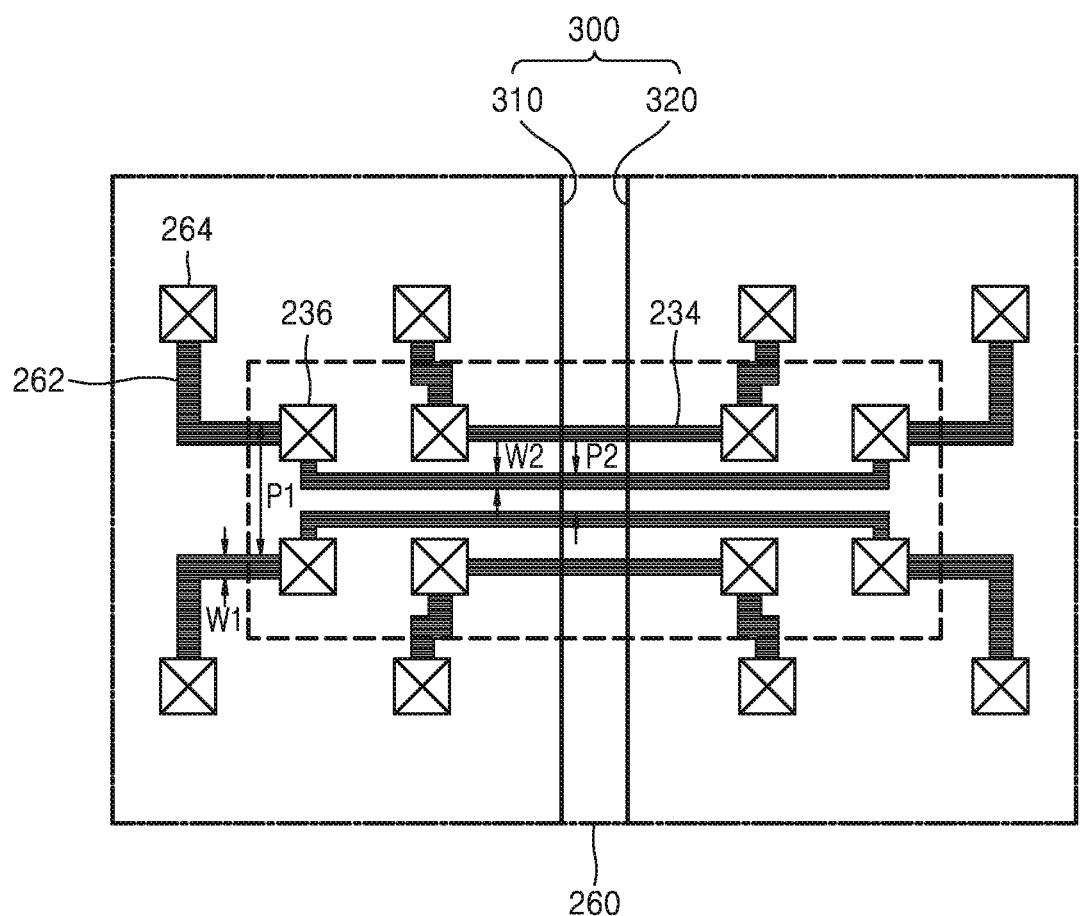
FIG. 1B is a plan layout of wiring of each of an interposer and an upper redistribution line structure in a semiconductor package.

FIG. 1A is a cross-sectional view of a semiconductor package 1 according to an embodiment.

Referring to FIG. 1A, the semiconductor package 1 includes a lower redistribution line structure 210, an interposer 230, an upper redistribution line structure 260, and/or at least two semiconductor chips 300. The interposer 230 may be disposed between the lower redistribution line structure 210 and the upper redistribution line structure 260, and the at least two semiconductor chips 300 may be adhered on the upper redistribution line structure 260.

The lower redistribution line structure 210 may include a plurality of lower insulating layers 216, a plurality of lower redistribution line patterns 212 disposed on at least one of top surfaces and bottom surfaces of the plurality of lower insulating layers 216, respectively, and a plurality of lower via patterns 214 penetrating each of at least one of the plurality of lower insulating layers 216 and contacting each of some of the plurality of lower redistribution line patterns 212.

Each of the plurality of lower insulating layers 216 may be formed from, for example, a material layer including an organic compound. According to an embodiment, each of the plurality of lower insulating layers 216 may be formed from a material layer including an organic polymer material. According to an embodiment, each of the plurality of lower insulating layer 216 may be formed of photosensitive polyimide (PSPI).

Each of the lower redistribution line pattern 212 and the lower via pattern 214 may include a metal, such as copper (Cu), tungsten (W), titanium (Ti), titanium tungsten (TiW), titanium nitride (TiN), tantalum (Ta), tantalum nitride (TaN), chromium (Cr), aluminium (Al), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), an alloy thereof, or a metal nitride, but is not limited thereto.

Each of the lower redistribution line pattern 212 and the lower via pattern 214 may include a seed layer contacting the lower insulating layer 216 and a conductive material layer on the seed layer. According to an embodiment, the seed layer may be formed via physical vapour deposition, and the conductive material layer may be formed via electroless plating. A portion of the lower redistribution line pattern 212 may be integrally formed together with a portion of the lower via pattern 214. For example, the lower redistribution line pattern 212 may be integrally formed with a portion of the lower via pattern 214, which contacts the top of the lower redistribution line pattern 212, or a portion of the lower via pattern 214, which contacts the bottom of the lower redistribution line pattern 212.

In FIG. 1A, the lower redistribution line pattern 212 is disposed only between two adjacent layers among the plurality of lower insulating layers 216, but is not limited thereto. According to an embodiment, the lower redistribution line pattern 212 may be disposed on a top surface of an uppermost layer and/or a bottom surface of a lowermost layer of the plurality of lower insulating layers 216.

A location including a circuit wire as the lower redistribution line pattern 212 is disposed, among top surfaces and bottom surfaces of the plurality of the lower insulating layers 216 and between two adjacent lower insulating layers 216 may be referred to as a layer. The lower redistribution line structure 210 may include a plurality of layers including a first lower layer LY11, a second lower layer LY12, and a third lower layer LY13.

A plurality of first connection pillars 220 and the interposer 230 may be adhered on the lower redistribution line structure 210. Each of the plurality of first connection pillars 220 may be disposed on the lower redistribution line structure 210 and spaced apart from the interposer 230.

The plurality of first connection pillars 220 may be disposed on portions of the plurality of lower redistribution line patterns 212, respectively. The first connection pillar 220 may connected to, for example, an uppermost layer of the lower redistribution line structure 210, for example, when the lower redistribution line structure 210 has three layers, the lower redistribution line pattern 212 disposed in the third lower layer LY13. The first connection pillar 220 may be formed of, for example, the same material as the lower redistribution line pattern 212 or lower via pattern 214.

The interposer 230 may be attached on the lower redistribution line structure 210 by, for example, a die attach film 240. According to an embodiment, the interposer 230 may be adhered on a top surface of the uppermost layer of the plurality of lower insulating layers 216 included in the lower redistribution line structure 210.

The interposer 230 may include an interposer substrate 232 and a plurality of connection wiring patterns 234 disposed on a top surface of the interposer substrate 232.

The interposer substrate 232 may be a semiconductor substrate. For example, the interposer substrate 232 may include silicon (Si). The plurality of connection wiring patterns 234 may be formed on the interposer substrate 232 via a general wiring process of a semiconductor device. The plurality of connection wiring patterns 234 may include connection line wiring of one layer, but is not limited thereto. According to an embodiment, the plurality of connection wiring patterns 234 may include connection line wiring of at least layers and a via plug interconnecting the connection line wiring of different layers. Here, an interwiring insulating layer may be provided between the connection line wiring and the via plug. The interposer 230 may be formed by performing only a wiring process without having to form an individual electronic device on a semiconductor substrate.

The interposer 230 may further include a plurality of second connection pillars 236 disposed on portions of the plurality of connection wiring patterns 234, respectively. According to an embodiment, the plurality of second connection pillars 236 may be adhered on portions adjacent to two ends of the plurality of connection wiring patterns 234, respectively.

The upper redistribution line structure 260 may be positioned on the first connection pillar 220 and the interposer 230. The upper redistribution line structure 260 may include at least one upper insulating layer 266, a plurality of upper redistribution line patterns 262 disposed on a top surface or bottom surface of the at least one upper insulating layer 266, and/or a plurality of upper via patterns 264 penetrating the upper insulating layer 266 and contacting portions of the plurality of upper redistribution line patterns 262, respectively.

The upper redistribution line pattern 262, the upper via pattern 264, and the upper insulating layer 266 are identical to the lower redistribution line pattern 212, the lower via pattern 214, and the lower insulating layer 216, respectively, and thus details thereof are not provided again.

The upper redistribution line structure 260 may include a plurality of layers including a first upper layer LY21 and a second upper layer LY22. The number of layers of the upper redistribution line structure 260 may be smaller than the number of layers of the lower redistribution line structure 210. For example, the lower redistribution line structure 210 may include at least three layers and the upper redistribution line structure 260 may include at least two layers that is less than the number of layers of the lower redistribution line structure 210.

The first connection pillar 220 may interconnect the lower redistribution line pattern 212 of the lower redistribution line structure 210 and the upper redistribution line pattern 262 of the upper redistribution line structure 260. For example, the first connection pillar 220 may contact and electrically interconnect the uppermost layer of the lower redistribution line structure 210, for example, the top surface of the lower redistribution line pattern 212 disposed at the third lower layer LY13, and the lowermost layer of the upper redistribution line structure 260, for example, the bottom surface of the upper redistribution line pattern 262 disposed at the first upper layer LY21.

The second connection pillar 236 may interconnect the connection wiring pattern 234 of the interposer 230 and the upper redistribution line pattern 262 of the upper redistribution line structure 260. For example, the second connection pillar 236 may contact and electrically interconnect the top surface of the connection wiring pattern 234 and the lowermost layer of the upper redistribution line structure 260, for example, the bottom surface of the upper redistribution line pattern 262 disposed at the first upper layer LY21.

A filling insulating layer 252 surrounding the first connection pillar 220 and the interposer 230 may be filled between the lower redistribution line structure 210 and the upper redistribution line structure 260. The filling insulating layer 252 may include epoxy molding compound (EMC) or a polymer material.

A side surface of the lower redistribution line structure 210, a side surface of the filling insulating layer 252, and a side surface of the upper redistribution line structure 260 may be aligned with each other in a vertical direction.

The first connection pillar 220 may have a first height H1 and the second connection pillar 236 may have a second height H2. The first height H1 may be greater than the second height H2. The interposer 230 may have a third height H3. The first height H1 may be greater than the third height H3. Since the interposer 230 includes the second connection pillar 236, the third height H3 may be greater than the second height H2.

An uppermost portion of the first connection pillar 220 and an uppermost portion of the second connection pillar 236 may be on a same level. Since the first height H1 of the first connection pillar 220 may be greater than the third height H3 of the interposer 230, a lowermost portion of the first connection pillar 220 may be at a level lower than the bottom surface of the interposer 230.

Each of the first and second connection pillars 220 and 236 may contact the bottom surface of the upper redistribution line pattern 262 exposed at the bottom surface of the upper redistribution line structure 260. Accordingly, the uppermost portion of the first connection pillar 220, the uppermost portion of the second connection pillar 236, and the bottom surface of the upper redistribution line structure 260 may be at a same level. Also, the uppermost portion of the first connection pillar 220, the uppermost portion of the second connection pillar 236, and the top surface of the filling insulating layer 252 may be coplanar.

The first connection pillar 220 may contact the top surface of the lower redistribution line pattern 212 by penetrating a portion of the lower insulating layer 216 of the lower redistribution line structure 210. Accordingly, the lowermost portion of the first connection pillar 220 may be at a level lower than the top surface of the lower redistribution line structure 210.

The at least two semiconductor chips 300 may be adhered on the upper redistribution line structure 260. The at least two semiconductor chips 300 may include a first semiconductor chip 310 and a second semiconductor chip 320. The first semiconductor chip 310 and the second semiconductor chip 320 may be spaced apart from each other on the upper redistribution line structure 260.

At least one of the semiconductor chips 300 may be, for example, a central processing unit (CPU) chip, a graphics processing unit (GPU) chip, or an application processor (AP) chip. At least one of the semiconductor chips 300 may be, for example, a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip.

According to an embodiment, the first semiconductor chip 310 may be a CPU chip, a GPU chip, or an AP chip, and the second semiconductor chip 320 may be a DRAM chip, an SRAM chip, a flash memory chip, an EEPROM chip, a PRAM chip, an MRAM chip, or an RRAM chip.

The first semiconductor chip 310 includes a first semiconductor substrate 312 and a first chip pad 314 disposed on one surface of the first semiconductor substrate 312. The second semiconductor chip 320 includes a second semiconductor substrate 322 and a second chip pad disposed on one surface of the second semiconductor substrate 322.

The first chip pad 314 of the first semiconductor chip 310 and the second chip pad 324 of the second semiconductor chip 320 may be connected to the upper redistribution line pattern 262 of the upper redistribution line structure 260 via a chip connection member 370. The chip connection member may be, for example, a bump, solder ball, or a conductive pillar.

The first and second semiconductor substrates 312 and 322 may include, for example, Si. Alternatively, the first and second semiconductor substrates 312 and 322 may include a semiconductor element, such as germanium (Ge), or a compound semiconductor, such as silicon carbide (SiC), gallium arsenide (GaAs), indium arsenide (InAs), or indium phosphide (InP). The first and second semiconductor substrates 312 and 322 may each have an active surface and an inactive surface opposite to the active surface. According to an embodiment, the active surface of each of the first and second semiconductor substrates 312 and 322 may face the upper redistribution line structure 260.

A semiconductor device including a plurality of individual devices of various types may be formed on the active surface of each of the first and second semiconductor substrates 312 and 322.

An under-fill material layer 380 surrounding the chip connection member 370 may be filled between the upper redistribution line structure 260 and each of the first and second semiconductor chips 310 and 320. The under-fill material layer 380 may include epoxy resin and formed via, for example, a capillary under-fill method. According to an embodiment, the under-fill material layer 380 may be a non-conductive film (NCF).

The semiconductor package 1 may be, for example, a fan-out package. A footprint occupied by the at least two semiconductor chips 300 may be smaller than a horizontal area of the upper and lower redistribution line structures 260 and 210. The footprint occupied by the at least two semiconductor chips 300 may overlap all of the upper redistribution line structure 260 and/or the lower redistribution line structure 210 in the vertical direction. A portion of the upper redistribution line pattern 262 of the upper redistribution line structure 260 and a portion of the lower redistribution line pattern 212 of the lower redistribution line structure 210 may extend to protrude further outward in a horizontal direction from the footprint occupied together by the at least two semiconductor chips 300.

The semiconductor package 1 may further include a board connection member 270 adhered below the lower redistribution line structure 210. According to an embodiment, the board connection member 270 may contact the bottom surface of the lower redistribution line pattern 212 through a pad opening PO penetrating the lowermost layer among the plurality of lower insulating layers 216 of the lower redistribution line structure 210. The board connection member 270 may be, for example, a bump, a solder ball, or a conductive pillar.

According to an embodiment, the semiconductor package 1 may further include a package base substrate 100. The package base substrate 100 may include a base board layer 110, and an upper pad 122 and a lower pad 124 disposed on a top surface and a bottom surface of the base board layer 110, respectively.

According to an embodiment, the package base substrate 100 may be a printed circuit board (PCB). For example, the package base substrate 100 may be a multi-layer PCB. The base board layer 110 may include at least one material selected among phenol resin, epoxy resin, and PI. The base board layer 110 may include at least one material selected among, for example, frame retardant 4 (FR4), tetrafunctional epoxy, polyphenylene ether, epoxy/polyphenylene oxide, bismaleimide triazine (BT)), Thermount, cyanate ester, PI, and liquid crystal polymer.

A top solder resist layer 132 and a bottom solder resist layer 134 exposing the upper pad 122 and the lower pad 124 may be formed on the top surface and the bottom surface of the base board layer 110, respectively. The board connection member 270 may be connected to the upper pad 122 and an external connection terminal 150 may be connected to the lower pad 124.

The package base substrate 100 may include wiring patterns electrically connecting the upper pad 122 and the lower pad 124, and a conductive via electrically interconnecting the wiring patterns. The wiring pattern may be disposed on the top surface, bottom surface, and/or inside of the base board layer 110. The wiring pattern may include, for example, electrolytically deposited (ED) copper foil, rolled-annealed (RA) copper foil, stainless steel foil, aluminum foil, ultra-thin copper foil, sputtered copper, or a copper alloy.

The conductive via may penetrate at least a portion of the base board layer 110. According to an embodiment, the conductive via may include Cu, Ni, stainless steel, or BeCu.

According to an embodiment, when the semiconductor package 1 does not include the package base substrate 100, the board connection member 270 may perform a function of an external connection terminal.

According to an embodiment, the semiconductor package 1 may further include a heat emitting member 500. The heat emitting member 500 may be, for example, a heat slug or a heat sink. The heat emitting member 500 may contact the top surface of the package base substrate 100 and surround the at least two semiconductor chips 300 as shown in FIG. 1A, but is not limited thereto. According to an embodiment, the heat emitting member 500 may contact the top surface of the at least two semiconductor chips 300 but may not contact the top surface of the package base substrate 100. According to an embodiment, a thermal interface material (TIM) may be disposed between the heat emitting member 500 and the top surface of the at least two semiconductor chips 300.

According to an embodiment, an electro-magnetic interface (EMI) shielding layer may be formed on an outer surface of the heat emitting member 500. The EMI shielding layer may be electrically connected to a ground layer included in the package base substrate 100.

FIG. 1B is a plan layout of the connection wiring pattern 234 of the interposer 230 and the upper redistribution line pattern 262 of the upper redistribution line structure 260 in the semiconductor package 1. FIG. 1B is a plan layout of wiring of each of an interposer and an upper redistribution line structure in a semiconductor package of FIG. 1A or each of semiconductor packages of FIGS. 2 through 8.

Referring to FIGS. 1A and 1B together, the interposer 230 includes the connection wiring pattern 234 and the second connection pillar 236 connected to two ends of the connection wiring pattern 234. The upper redistribution line structure 260 includes the upper redistribution line pattern 262 interconnecting the upper via pattern 264 and the second connection pillar 236. The upper via pattern 264 may be electrically connected to the first chip pad 314 of the first semiconductor chip 310 and the second chip pad 324 of the second semiconductor chip 320.

A width W1 and a minimum pitch P1 of the upper redistribution line pattern 262 may be greater than a width W2 and a minimum pitch P2 of the connection wiring pattern 234, respectively. A width, minimum pitch, and thickness of the lower redistribution line pattern 212 may be equal to or similar to the width W1, minimum pitch P1, and thickness t1 of the upper redistribution line pattern 262. According to an embodiment, the thickness t1 of the upper redistribution line pattern 262 may be greater than a thickness t2 of the connection wiring pattern 234.

The first semiconductor chip 310 may be electrically connected to the package base substrate 100 via the upper redistribution line pattern 262 and upper via pattern 264 of the upper redistribution line structure 260, the first connection pillar 220, and the lower redistribution line pattern 212 and lower via pattern 214 of the lower redistribution line structure 210. The second semiconductor chip 320 may be electrically connected to the package base substrate 100 via the upper redistribution line pattern 262 and upper via pattern 264 of the upper redistribution line structure 260, the first connection pillar 220, and the lower redistribution line pattern 212 and lower via pattern 214 of the lower redistribution line structure 210. The first and second semiconductor chips 310 and 320 may be electrically connected to each other through the upper redistribution line pattern 262 and the upper via pattern 264 of the upper redistribution line structure 260 and the interposer 230, without passing through the lower redistribution line pattern 212 and the lower via pattern 214 of the lower redistribution line structure 210, in the semiconductor package 1.

For example, transmission of a power signal, a ground signal, a control signal, a clock signal, or the like from the board connection member 270 to each of the first and second semiconductor chips 310 and 320, and data transmission and/or reception between the board connection member 270 and each of the first and second semiconductor chips 310 and 320 may be performed via the lower redistribution line pattern 212 and the lower via pattern 214 of the lower redistribution line structure 210, the first connection pillar 220, and the upper redistribution line pattern and upper via pattern 264 of the upper redistribution line structure 260. On the other hand, for example, data transmission and/or reception between the first and second semiconductor chips 310 and 320, and signal transmission for clock synchronization between the first and second semiconductor chips 310 and 320 may be performed only via the upper redistribution line pattern 262 and upper via pattern 264 of the upper redistribution line structure 260 and the interposer 230, without passing through the lower redistribution line pattern 212 and lower via pattern 214 of the lower redistribution line structure 210.

The semiconductor package 1 according to an embodiment transmits a signal between the at least two semiconductor chips 300, for example, the first and second semiconductor chips 310 and 320, via the interposer 230 capable of realizing relatively fine pitch, and transmits a signal between the board connection member 270 and each of the first and second semiconductor chips 310 and 320 via the first connection pillar 220 and the lower redistribution line structure 210, which are manufactured at relatively low cost.

For example, since a semiconductor package, in which a signal between a package base substrate and each of two semiconductor chips, and a signal between the two semiconductor chips are both transmitted via an interposer, includes a relatively large interposer, manufacturing costs may increase. On the other hand, since a semiconductor package, in which a signal between a package base substrate and each of two semiconductor chips, and a signal between the two semiconductor chips are both transmitted via a redistribution line structure, is unable to realize a fine pitch, the size of the semiconductor package may increase or the yield may decrease.

However, since the semiconductor package 1 transmits a signal between the first and second semiconductor chips 310 and 320 via the interposer 230 and transmits a signal between the package base substrate 100 and each of the first and second semiconductor chips 310 and 320 via the first connection pillar 220 and the lower redistribution line structure 210, the required size of the interposer 230 is relatively small. Accordingly, the semiconductor package 1 may have low manufacturing costs and high yield.

FIGS. 2 through 8 are cross-sectional views of semiconductor packages 1a through 1g according to embodiments. Details of FIGS. 2 through 8, which overlap those of FIGS. 1A and 1B may be omitted, and differences thereof are mainly described.

Figure 2:
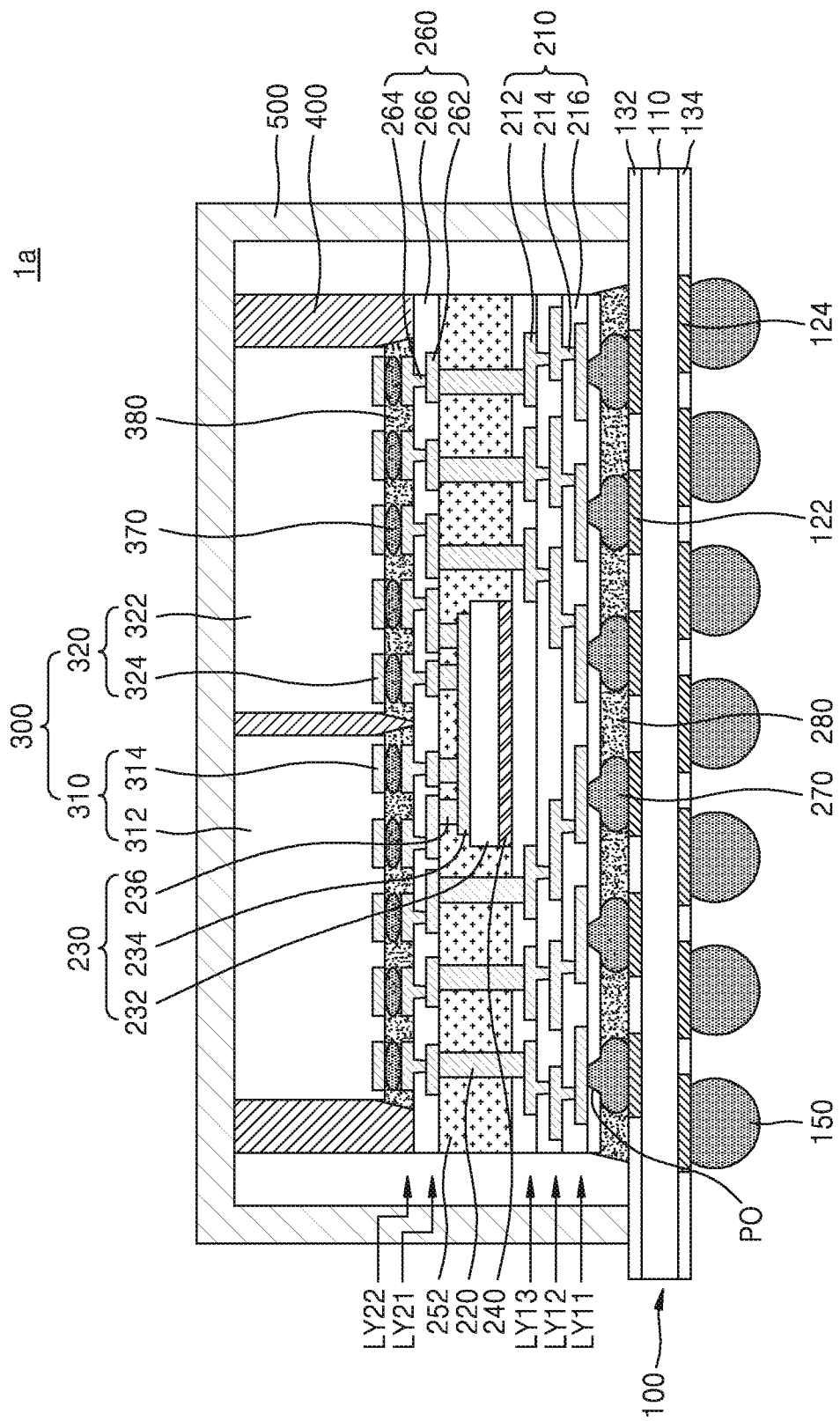
FIGS. 2 through 8 are cross-sectional views of semiconductor packages according to embodiments.

Referring to FIG. 2, the semiconductor package 1a includes the lower redistribution line structure 210, the interposer 230, the upper redistribution line structure 260, and/or the at least two semiconductor chips 300. The interposer 230 is disposed between the lower redistribution line structure 210 and the upper redistribution line structure 260, and the at least two semiconductor chips 300 may be adhered on the upper redistribution line structure 260.

The semiconductor package 1a further includes a molding member 400 surrounding the at least two semiconductor chips 300 on the upper redistribution line structure 260. The molding member 400 may be formed of, for example, EMC. The molding member 400 may surround the top surface of the upper redistribution line structure 260 and each of the at least two semiconductor chips 300, e.g., the side surfaces of the first and second semiconductor chips 310 and 320.

The molding member 400 may expose the top surfaces of the at least two semiconductor chips 300, e.g., the top surfaces of the first and second semiconductor chips 310 and 320. The top surface of the molding member 400 and the top surfaces of the at least two semiconductor chips 300, e.g., the top surfaces of the first and second semiconductor chips 310 and 320, may be coplanar.

According to an embodiment, the under-fill material layer 380 may be a portion of the molding member 400 formed of molded under-fill (MUF). The heat emitting member 500 may contact the top surfaces of the at least two semiconductor chips 300 and the top surface of the molding member 400. The side surface of the lower redistribution line structure 210, the side surface of the filling insulating layer 252, the side surface of the upper redistribution line structure 260, and/or the side surface of the molding member 400 may be aligned in the vertical direction.

Figure 3:
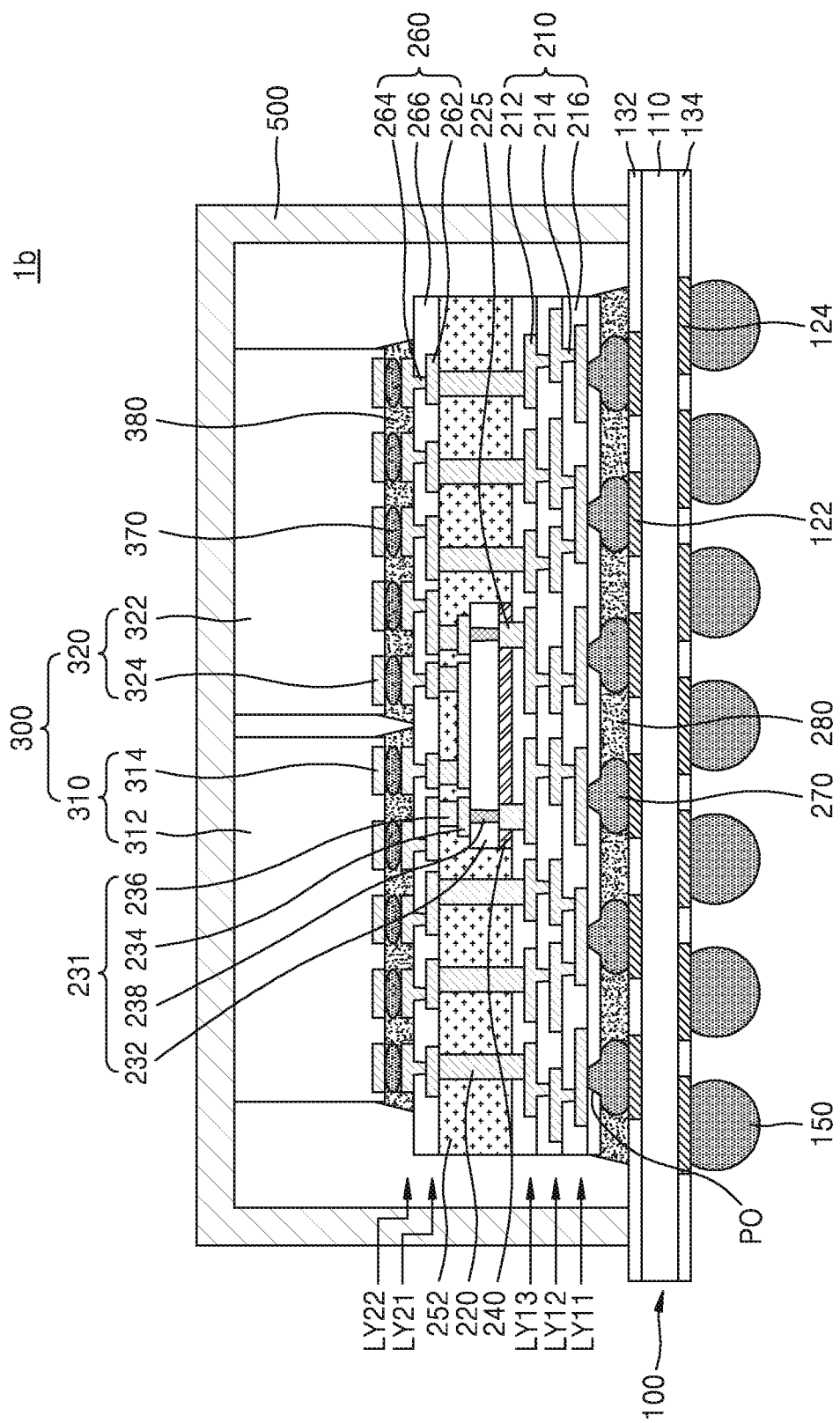

Referring to FIG. 3, the semiconductor package 1b includes the lower redistribution line structure 210, an interposer 231, the upper redistribution line structure 260, and the at least two semiconductor chips 300. The interposer 231 is disposed between the lower redistribution line structure 210 and the upper redistribution line structure 260, and/or the at least two semiconductor chips 300 may be adhered on the upper redistribution line structure 260.

The interposer 231 includes the interposer substrate 232, the connection wiring pattern 234 disposed on the top surface of the interposer substrate 232, the second connection pillar 236 disposed on a portion of the connection wiring pattern 234, and/or a through electrode 238 penetrating the interposer substrate 232 and contacting the bottom surface of the connection wiring pattern 234.

The through electrode 238 may electrically interconnect the connection wiring pattern 234 and the lower redistribution line pattern 212. According to an embodiment, a connecting bump 225 penetrating the die attach film 240 may be disposed between the through electrode 238 and the lower redistribution line pattern 212. The die attach film 240 may be, for example, a non-conductive film.

According to an embodiment, the connecting bump 225 may be formed on the lower redistribution line pattern 212 in the similar manner as the first connection pillar 220. According to another embodiment, the connecting bump 225 may be formed on the through electrode 238 on the bottom surface of the interposer 231 while manufacturing the interposer 231. According to another embodiment, the connecting bump 225 may include as an upper portion formed on the through electrode 238 on the bottom surface of the interposer 231 while manufacturing the interposer 231, and a lower portion formed on the lower redistribution line pattern 212 in the similar manner as the first connection pillar 220.

The semiconductor package 1b according to an embodiment may transmit a signal between the at least two semiconductor chips 300, for example, between the first and second semiconductor chips 310 and 320 via the interposer 231 without through the lower redistribution line structure 210, transmit some of signals between the board connection member 270 and each of the first and second semiconductor chips 310 and 320 via the first connection pillar 220 and the lower redistribution line structure 210 without through the interposer 230, and transmit the remaining of the signals between the board connection member 270 and each of the first and second semiconductor chips 310 and 320 via the interposer 230 and the lower redistribution line structure 210 together.

For example, among the signals between the board connection member 270 and each of the first and second semiconductor chips 310 and 320, transmission and reception of a power signal, a ground signal, and data may be performed via the lower redistribution line structure 210, while transmission and reception of a control signal and a clock signal may be performed via the interposer 230 and the lower redistribution line structure 210 together. However, this is only an example and thus not limited. In other words, a path of each of the signals between the board connection member 270 and each of the first and second semiconductor chips 310 and 320 may be determined considering electric characteristics and horizontal cross-sections of the first connection pillar 220 and the through electrode 238l Referring to FIG. 4, the semiconductor package 1c includes the lower redistribution line structure 210, the interposer 231, the upper redistribution line structure 260, and/or the at least two semiconductor chips 300. The interposer 231 may be disposed between the lower redistribution line structure 210 and the upper redistribution line structure 260, and the at least two semiconductor chips 300 may be adhered on the upper redistribution line structure 260. The semiconductor package 1c further includes the molding member 400 surrounding the at least two semiconductor chips 300 on the upper redistribution line structure 260.

The interposer 231 includes the interposer substrate 232, the connection wiring pattern 234 disposed on the top surface of the interposer substrate 232, the second connection pillar 236 disposed on a portion of the connection wiring pattern 234, and a through electrode 238 penetrating the interposer substrate 232 and contacting the bottom surface of the connection wiring pattern 234.

Figure 5:
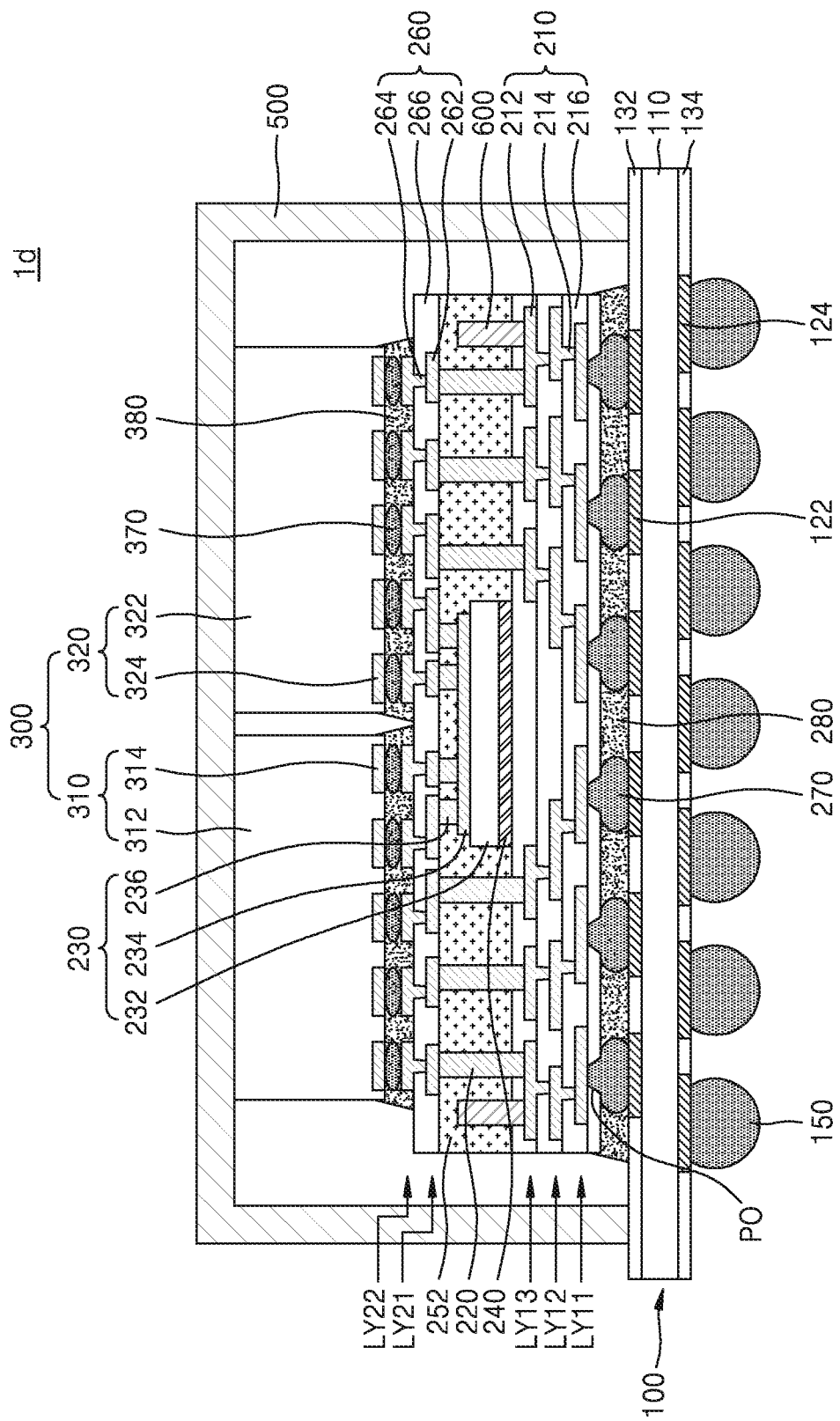

Referring to FIG. 5, the semiconductor package 1d includes the lower redistribution line structure 210, the interposer 230, the upper redistribution line structure 260, and/or the at least two semiconductor chips 300. The interposer 230 may be disposed between the lower redistribution line structure 210 and the upper redistribution line structure 260, and the at least two semiconductor chips 300 may be adhered on the upper redistribution line structure 260.

The semiconductor package 1d further includes a passive device 600 adhered to the lower redistribution line structure 210. The passive device 600 may be, for example, a chip resistor, a chip capacitor, an inductance, a quartz for clock generation, or a temperature sensor. According to an embodiment, the semiconductor package 1d may further include an active device, such as a switch, a direct current (DC)-DC converter, or a voltage regulator, adhered to the lower redistribution line structure 210, like the passive device 600.

The passive device 600 may be disposed on the lower redistribution line structure 210 while be spaced apart from the first connection pillar 220 and the interposer 230. The passive device 600 may be disposed on a portion of the lower redistribution line pattern 212. The passive device 600 may be disposed on a layer of an uppermost portion of the lower redistribution line structure 210, for example, when the lower redistribution line structure 210 includes three layers, on the lower redistribution line pattern 212 disposed on the third lower layer LY13.

The filling insulating layer 252 may surround the first connection pillar 220, the interposer 230, and the passive device 600, between the lower redistribution line structure 210 and the upper redistribution line structure 260.

Figure 6:
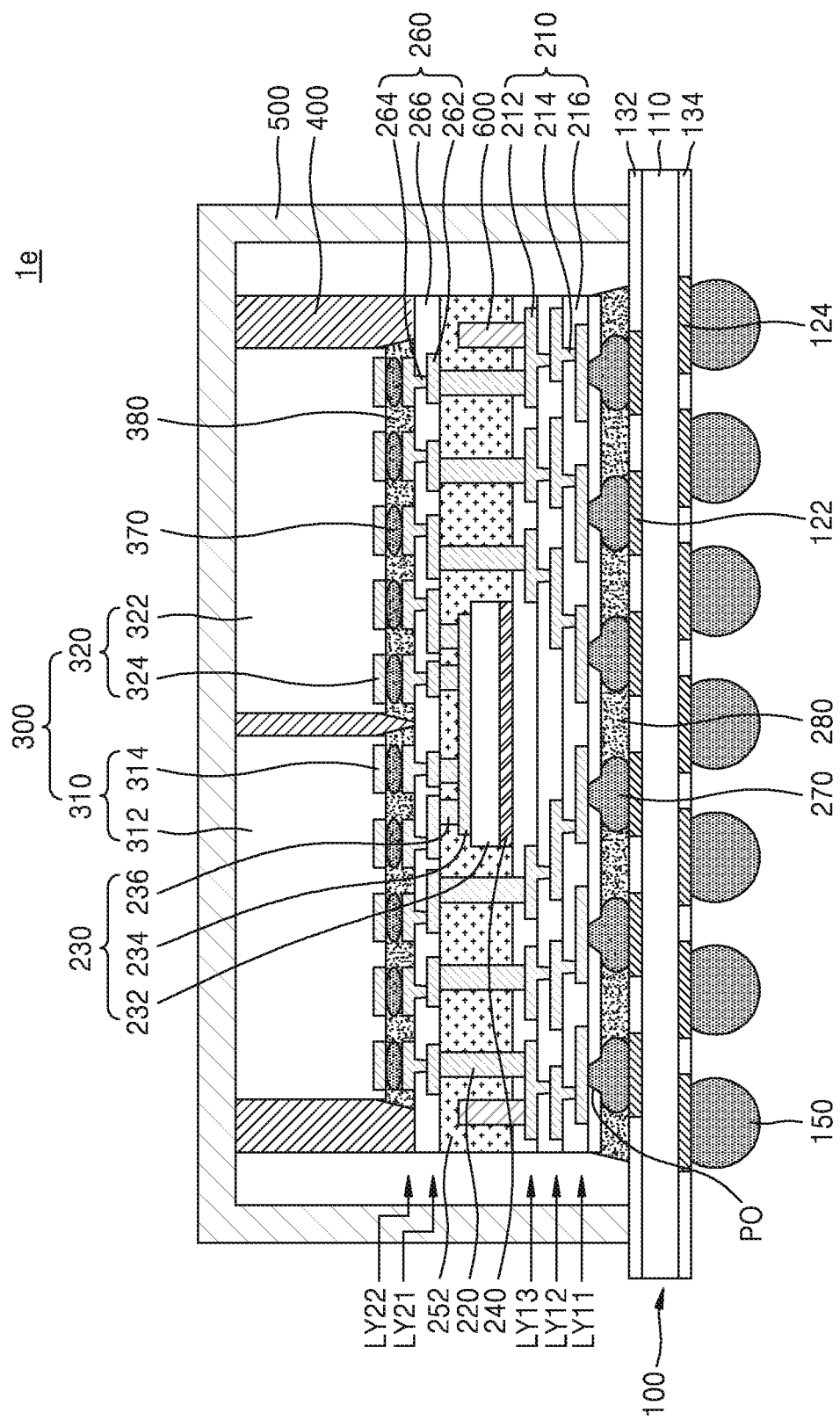

Referring to FIG. 6, the semiconductor package 1e includes the lower redistribution line structure 210, the passive device 600 adhered to the lower redistribution line structure 210, the interposer 230, the upper redistribution line structure 260, the at least two semiconductor chips 300, and/or the molding member 400 surrounding the at least two semiconductor chips 300 on the upper redistribution line structure 260. The interposer 230 may be disposed between the lower redistribution line structure 210 and the upper redistribution line structure 260, and the at least two semiconductor chips 300 may be adhered on the upper redistribution line structure 260.

Figure 7:
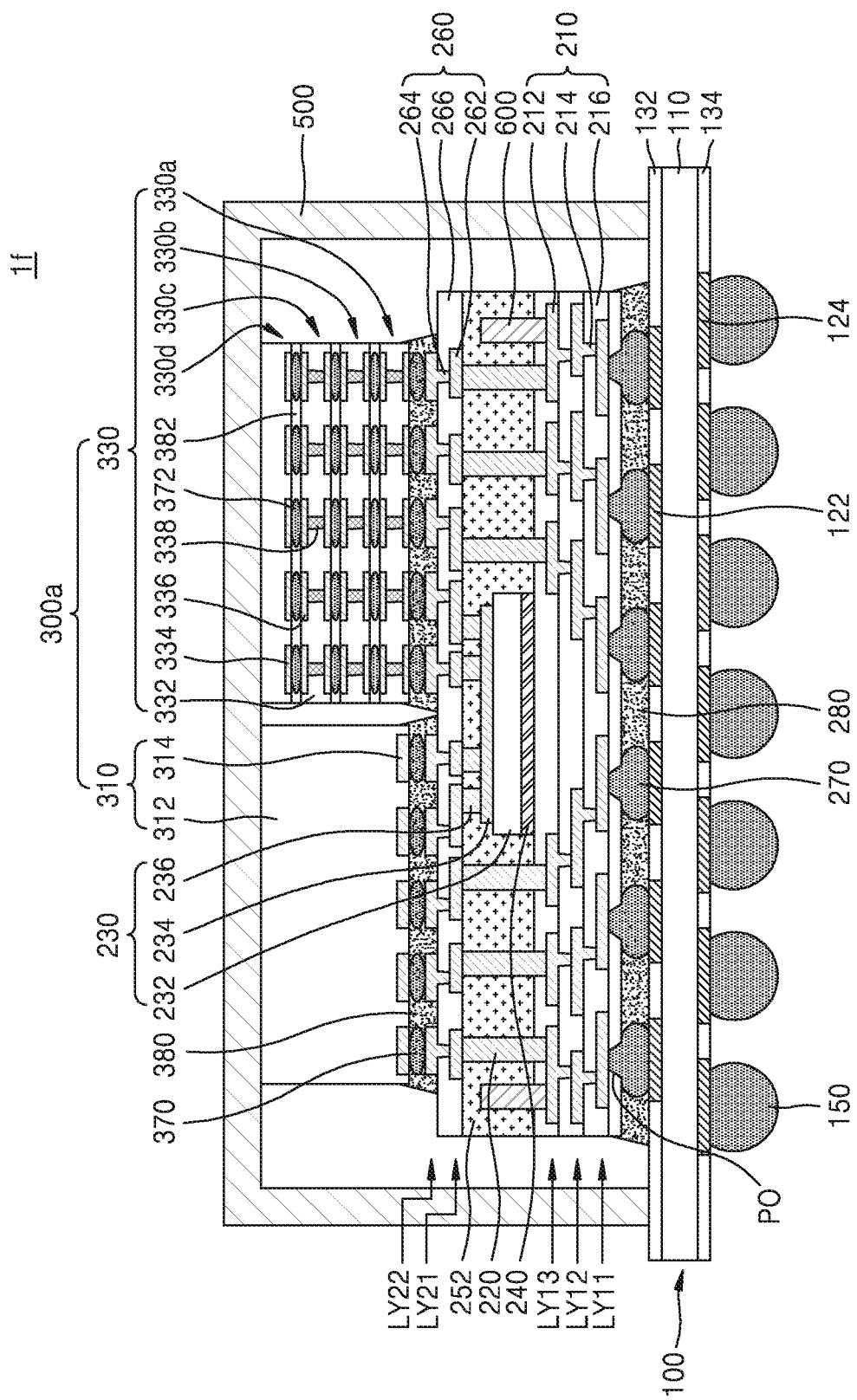

Referring to FIG. 7, the semiconductor package if includes the lower redistribution line structure 210, the interposer 230, the upper redistribution line structure 260, and/or a plurality of semiconductor chips 300a. The interposer 230 may be disposed between the lower redistribution line structure 210 and the upper redistribution line structure 260, and the plurality of semiconductor chips 300a may be adhered on the upper redistribution line structure 260.

The plurality of semiconductor chips 300a may include the first semiconductor chip 310 and a second semiconductor chip 330. The first semiconductor chip 310 may be, for example, a CPU chip, a GPU chip, or an AP chip, and the second semiconductor chip 330 may be a high bandwidth memory (HBM) DRAM chip.

According to an embodiment, the second semiconductor chip 320 may be a stack of a plurality of memory semiconductor chips, wherein according to JEDEC Standard Definition, a stack denote all memory chips in a memory system taken together in one assembly. In other words, the second semiconductor chip 320 may include a plurality of slices 330a through 330d, wherein according to JEDEC Standard Definition, a slice denotes one memory chip in a stack of memory chips.

According to an embodiment, among the plurality of slices 330a through 330d, the slice 330a at the bottom may be a buffer chip including a serial-parallel converting circuit, and the remaining slices 330b through 330d may each be an HBM DRAM semiconductor chip.

Each of the plurality of slices 330a through 330d includes a semiconductor substrate 332 and a lower chip pad 334 disposed on a bottom surface, e.g., an active surface, of the semiconductor substrate 332. Among the plurality of slices 330a through 330d, each of the slices 330a through 330c excluding the slice 330d may include a through electrode 338 electrically interconnecting an upper chip pad 336 disposed on a top surface, e.g., inactive surface, of the semiconductor substrate 332, and the lower chip pad 334.

A slice connecting terminal 372 and a slice adhesive layer 382 surrounding the slice connecting terminal 372 may be disposed between the plurality of slices 330a through 330d, wherein the slice connecting terminal 372 and the slice adhesive layer 382 electrically interconnect, among the plurality of slices 330a through 330d, the lower chip pad 334 of a top slice and the upper chip pad 336 of a bottom slice. The slice connecting terminal 372 may be, for example, a bump or a solder ball. The slice adhesive layer 382 may be, for example, a non-conductive film.

Figure 8:
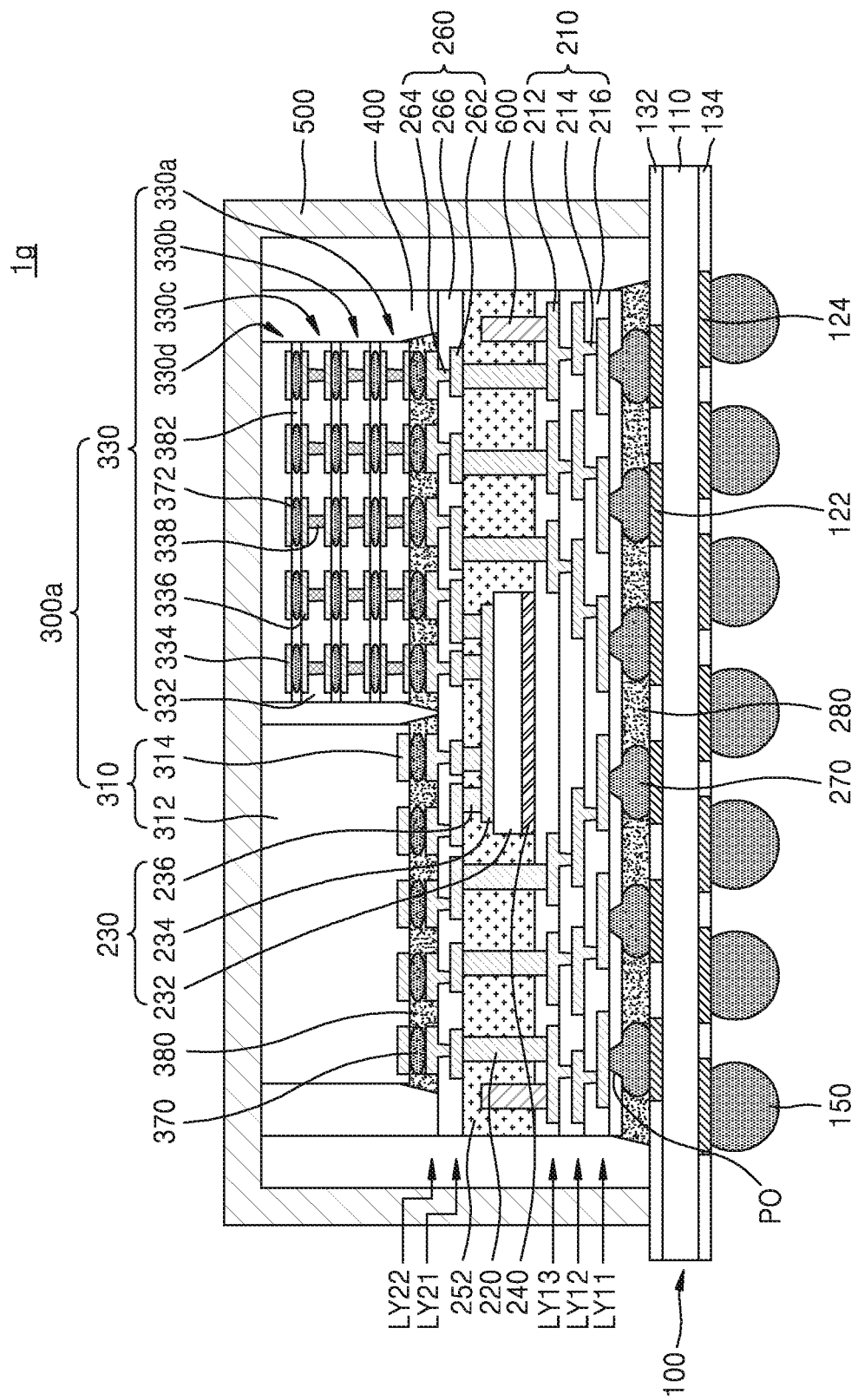

Referring to FIG. 8, the semiconductor package 1g includes the lower redistribution line structure 210, the passive device 600 adhered to the lower redistribution line structure 210, the interposer 230, the upper redistribution line structure 260, the plurality of semiconductor chips 300a, and/or the molding member 400 surrounding the plurality of semiconductor chips 300a on the upper redistribution line structure 260. The interposer 230 may be disposed between the lower redistribution line structure 210 and the upper redistribution line structure 260, and the plurality of semiconductor chips 300a may be adhered on the upper redistribution line structure 260.

FIGS. 9A through 9I are cross-sectional views for explaining a method of manufacturing a semiconductor package, according to an embodiment. For example, FIGS. 9A through 9I are cross-sectional views for explaining a method of manufacturing the semiconductor package 1 of FIG. 1A.

Figure 9A:
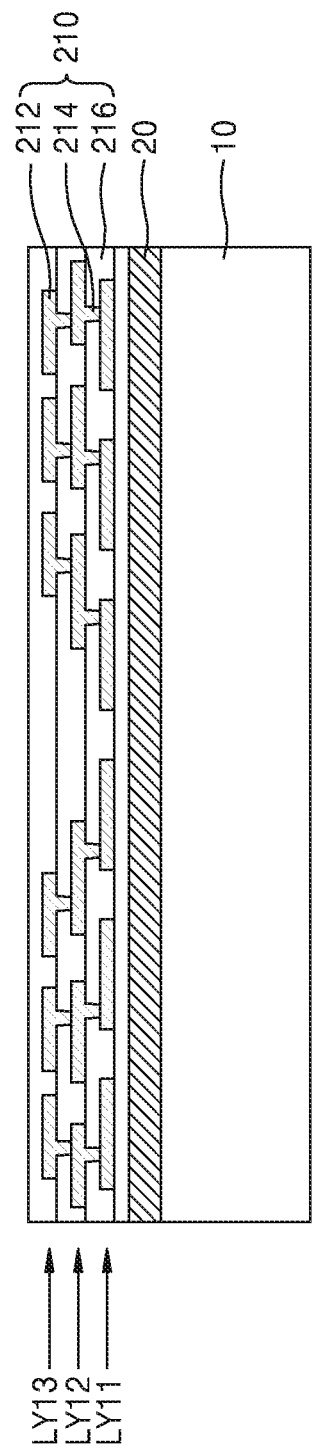
FIGS. 9A through 9I are cross-sectional views for explaining a method of manufacturing a semiconductor package, according to an embodiment.

Referring to FIG. 9A, the lower redistribution line structure 210 is formed on a carrier substrate 10 to which a release film 20 is adhered. The lower redistribution line structure 210 may include the plurality of lower insulating layers 216, the lower redistribution line pattern 212 disposed on the top surface or the bottom surface of each of the plurality of lower insulating layers 216, and/or the lower via pattern 214 penetrating each of the plurality of lower insulating layers 216.

The lower redistribution line structure 210 may be formed by sequentially stacking each of the plurality of lower insulating layers 216, and the lower redistribution line pattern 212 or both the lower via pattern 214 and the lower redistribution line pattern 212.

For example, a detailed method of manufacturing the lower redistribution line structure 210 is as follows. First, the lower insulating layer 216 of a lowermost layer is formed, and the lower redistribution line pattern 212 forming a layer of a lowermost portion, for example, the first lower layer LY11, is formed on the lower insulating layer 216 of the lowermost layer. Then, the lower insulating layer 216 exposing a portion of the lower redistribution line pattern 212 including the first lower layer LY11 is formed on the lower redistribution line pattern 212 including the first lower layer LY11, and the lower via pattern 214 including the first lower layer LY11 connected to the lower redistribution line pattern 212 are formed. Here, the lower via pattern 214 and the lower redistribution line pattern 212 may be integrally formed. By repeating such processes, the plurality of lower insulating layers 216 and the lower redistribution line structure 210 including a plurality of layers including the first lower layer LY11, the second lower layer LY12, and the third lower layer LY13 may be formed.

According to an embodiment, the lower insulating layer 216 of the uppermost layer of the lower redistribution line structure 210 may be formed to cover all of a layer of an uppermost portion, for example, the lower redistribution line pattern 212 including the third lower layer LY13.

Figure 9B:
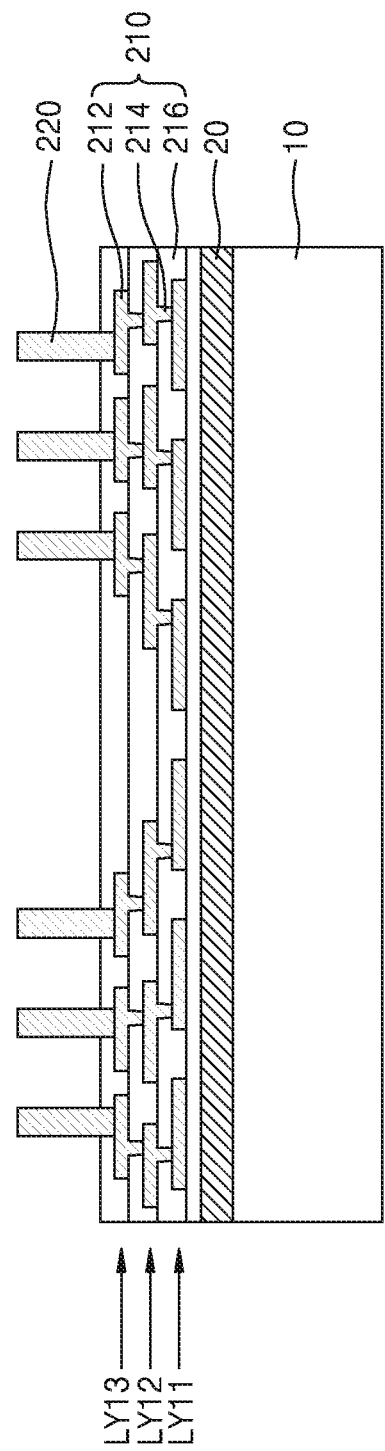

Referring to FIG. 9B, the first connection pillar 220 connected to the layer of the uppermost portion of the lower redistribution line structure 210, for example, the lower redistribution line pattern 212 including the third lower layer LY13, is formed on the lower redistribution line structure 210.

In order to form the first connection pillar 220, a mask pattern for opening a position where the first connection pillar 220 is to be formed is formed on the lower redistribution line structure 210 and an exposing portion of the lower insulating layer 216 of the uppermost layer of the lower redistribution line structure 210 is removed by using the mask pattern as an etch mask, so as to expose a portion of the lower redistribution line pattern 212 forming the layer of the uppermost portion of the lower redistribution line structure 210, for example, the third lower layer LY13. Then, electroless plating is performed on the exposed lower redistribution line pattern 212 to form the first connection pillar 220. According to an embodiment, after forming a seed layer on the lower redistribution line structure 210, a conductive material layer may be formed by performing electroless plating by using the seed layer as a seed, and then the mask pattern may be removed to form the first connection pillar 220.

Figure 9C:
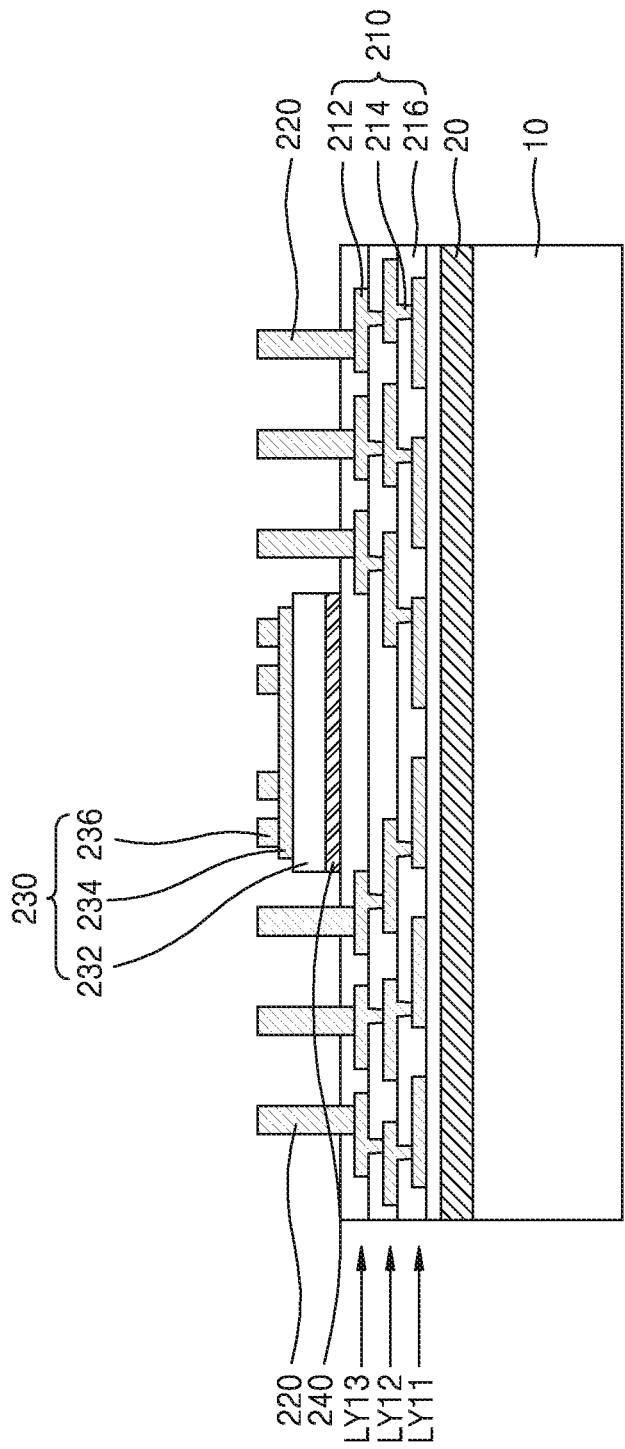

Referring to FIG. 9C, the interposer 230 is adhered on the lower redistribution line structure 210. The interposer 230 may be disposed on the lower redistribution line structure 210 such as to be spaced apart from the first connection pillar 220. The interposer 230 may be adhered on the lower redistribution line structure 210 by using, for example, the die attach film 240. The interposer 230 may be adhered on a top surface of an uppermost layer among the plurality of lower insulating layers 216 included in the lower redistribution line structure 210.

The interposer 230 may include the interposer substrate 232, the connection wiring pattern 234 disposed on the top surface of the interposer substrate 232, and/or the second connection pillar 236 disposed on a portion of the connection wiring pattern 234. The top surface of the interposer substrate 232 may be at a level lower than the uppermost portion of the first connection pillar 220.

Figure 4:
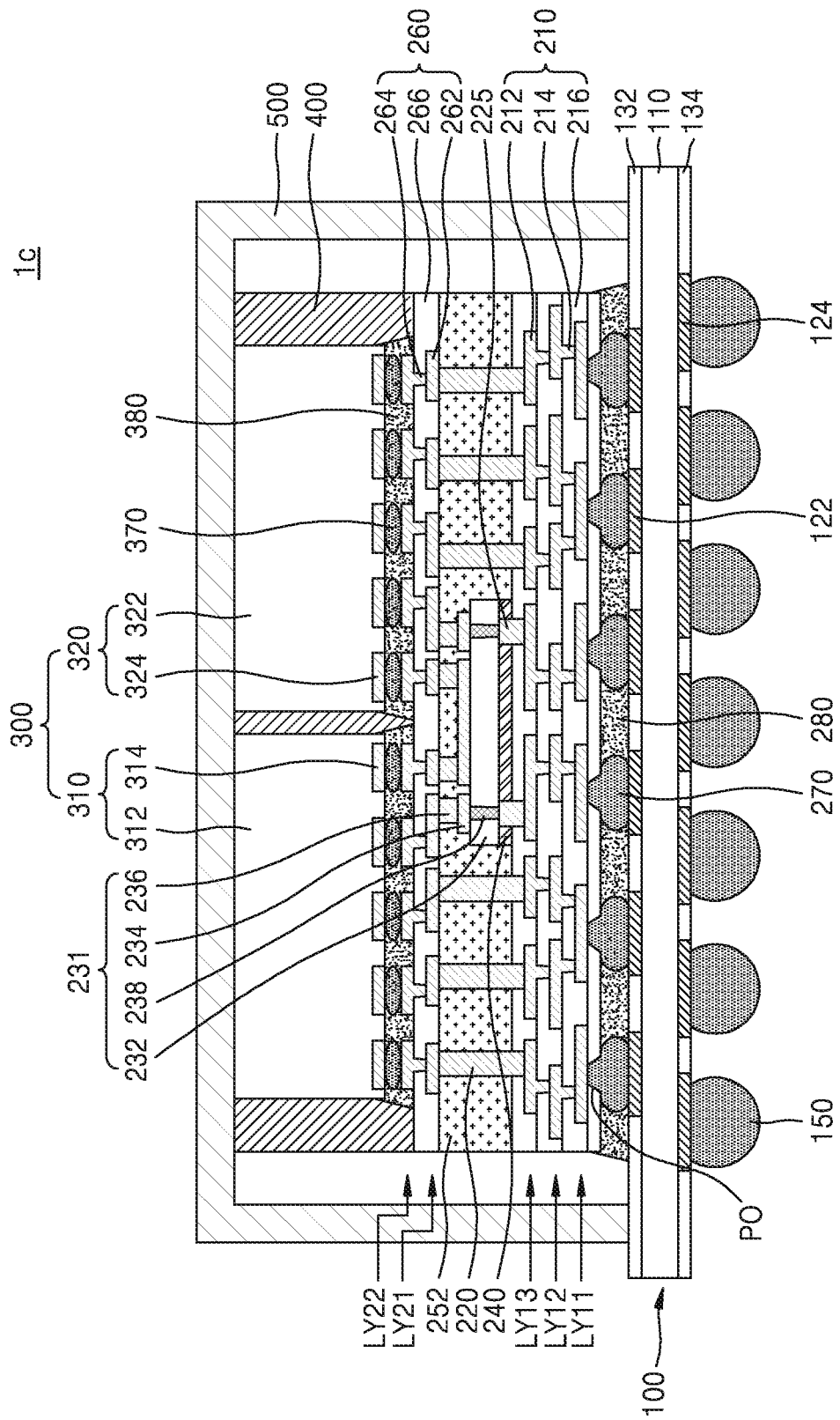

In the semiconductor package 1b or 1c of FIG. 3 or 4, the interposer 231 of FIG. 3 or 4 may be adhered on the lower redistribution line structure 210 instead of the interposer 230, wherein the interposer 231 includes the interposer substrate 232, the connection wiring pattern 234 disposed on the top surface of the interposer substrate 232, the second connection pillar 236 disposed on a portion of the connection wiring pattern 234, and the through electrode 238 penetrating the interposer substrate 232 and contacting the bottom surface of the connection wiring pattern 234.

Figure 9D:
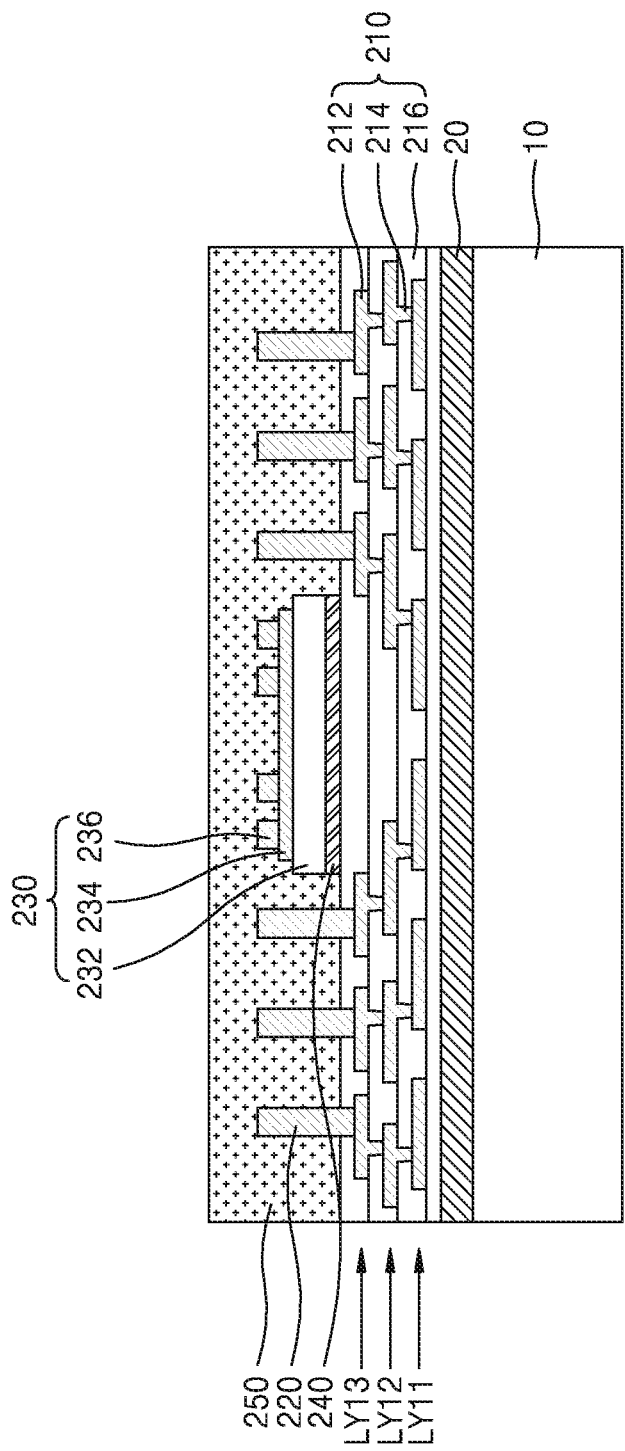

Referring to FIG. 9D, a filling insulating material layer 250 covering the first connection pillar 220 and the interposer 230 is formed on the lower redistribution line structure 210. The filling insulating material layer 250 may be formed of epoxy molding compound (EMC) or polymer material.

In the semiconductor package 1d or 1e of FIG. 5 or 6, before the filling insulating material layer 250 is formed, the passive device 600 of FIG. 5 or 6 may be adhered to the lower redistribution line structure 210 such as to be spaced apart from the first connection pillar 220 and the interposer 230.

Figure 9E:
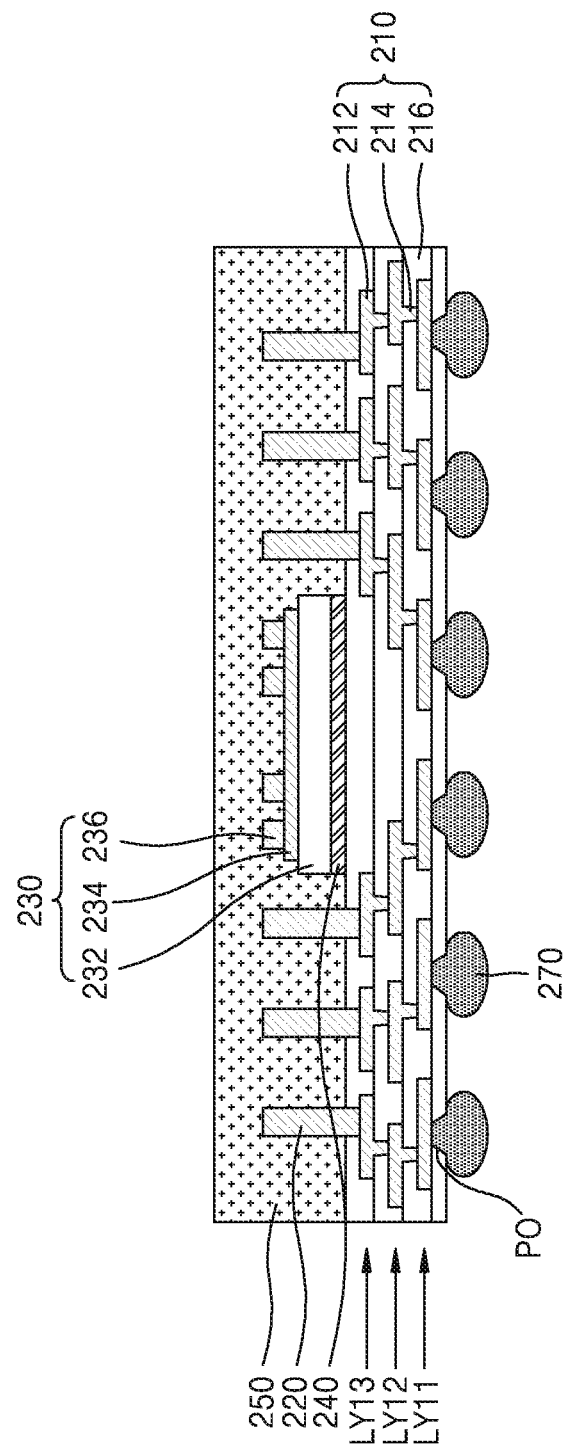

Referring to FIG. 9E, the carrier substrate 10 to which the release film 20 of FIG. 9D is adhered is separated from the lower redistribution line structure 210. Then, a portion of the lower insulating layer 216 of the lowermost layer among the plurality of lower insulating layers 216 is removed to form the pad opening PO that exposes a portion of the lower redistribution line pattern 212 including the first lower layer LY11, and the board connection member 270 contacting the bottom surface of the lower redistribution line pattern 212 including the first lower layer LY11 is adhered through the pad opening PO.

Figure 9F:
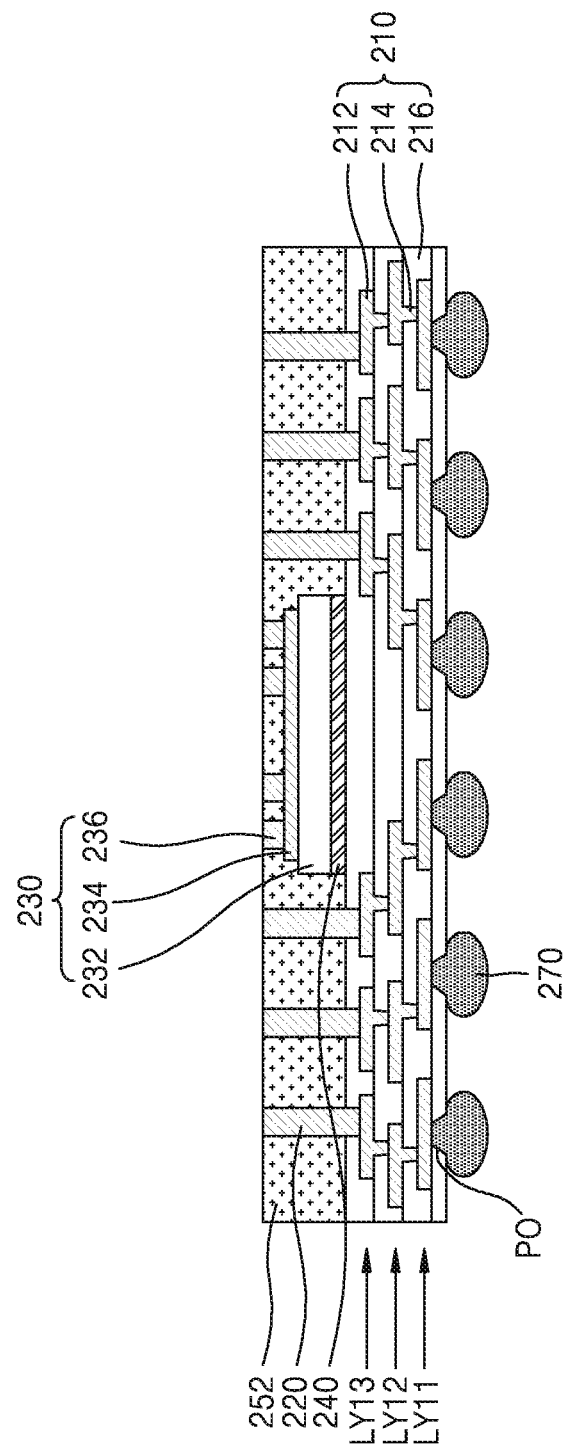

Referring to FIG. 9F, an upper portion of the filling insulating material layer 250 of FIG. 9E is removed such that the first and second connection pillars 220 and 236 are exposed, thereby forming the filling insulating layer 252. The filling insulating layer 252 may cover the top surface of the lower redistribution line structure 210 and the side surface of the first connection pillar 220, and cover the side and top surfaces of the interposer 230 excluding the uppermost portion of the second connection pillar 236. In other words, the filling insulating layer 252 may cover the side surfaces of the first and second connection pillars 220 and 236 while exposing the top surfaces thereof.

The uppermost portion of the first connection pillar 220, the uppermost portion of the second connection pillar 236, and the bottom surface of the upper redistribution line structure 260 may be on a same level. Also, the uppermost portion of the first connection pillar 220, the uppermost portion of the second connection pillar 236, and the top surface of the filling insulating layer 252 may be coplanar.

Figure 9G:
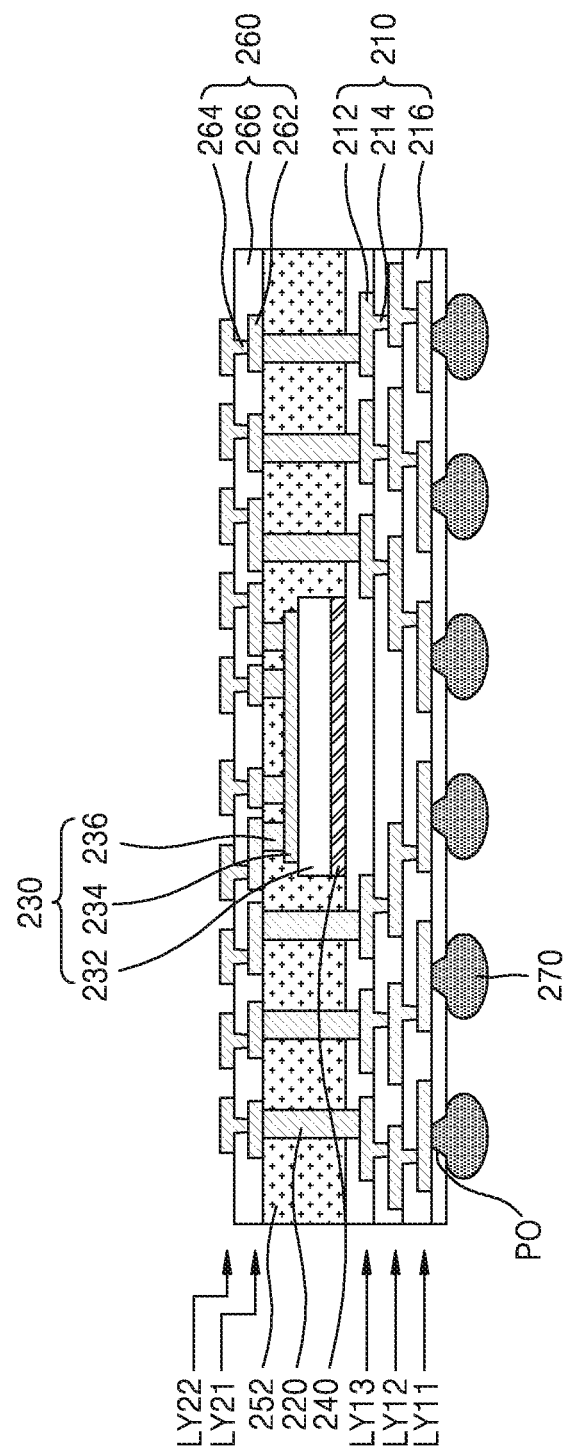

Referring to FIG. 9G, the upper redistribution line structure 260 is formed on the filling insulating layer 252. The upper redistribution line structure 260 may include the at least one upper insulating layer 266, the upper redistribution line pattern 262 disposed on the top or bottom surface of the at least one upper insulating layer 266, and the upper via pattern 264 penetrating the at least one upper insulating layer 266.

The upper redistribution line structure 260 may be formed by sequentially stacking the upper redistribution line pattern 262 or the upper via pattern 264 and the upper redistribution line pattern 262, and the upper insulating layer 266.

For example, a detailed method of manufacturing the upper redistribution line structure 260 is as follows. First, the upper redistribution line pattern 262 forming the layer of the lowermost portion of the upper redistribution line structure 260, for example, the first upper layer LY21, is formed to contact each of the first and second connection pillars 220 and 236. Then, the upper insulating layer 266 exposing a portion of the upper redistribution line pattern 262 including the first upper layer LY21 is formed on the upper redistribution line pattern 262 including the first upper layer LY21, and the upper via pattern 264 including the first upper layer LY21 connected to the upper redistribution line pattern 262 are formed. Here, the upper via pattern 264 and the upper redistribution line pattern 262 may be integrally formed. By repeating such processes, the at least one upper insulating layer 266 and the upper redistribution line structure 260 including a plurality of layers including the first upper layer LY21 and the second upper layer LY22 may be formed.

The number of layers of the upper redistribution line structure 260 may be smaller than the number of layers of the lower redistribution line structure 210. For example, the lower redistribution line structure 210 may include at least three layers and the upper redistribution line structure 260 may include at least two layers that is smaller than that of the lower redistribution line structure 210.

Figure 9H:
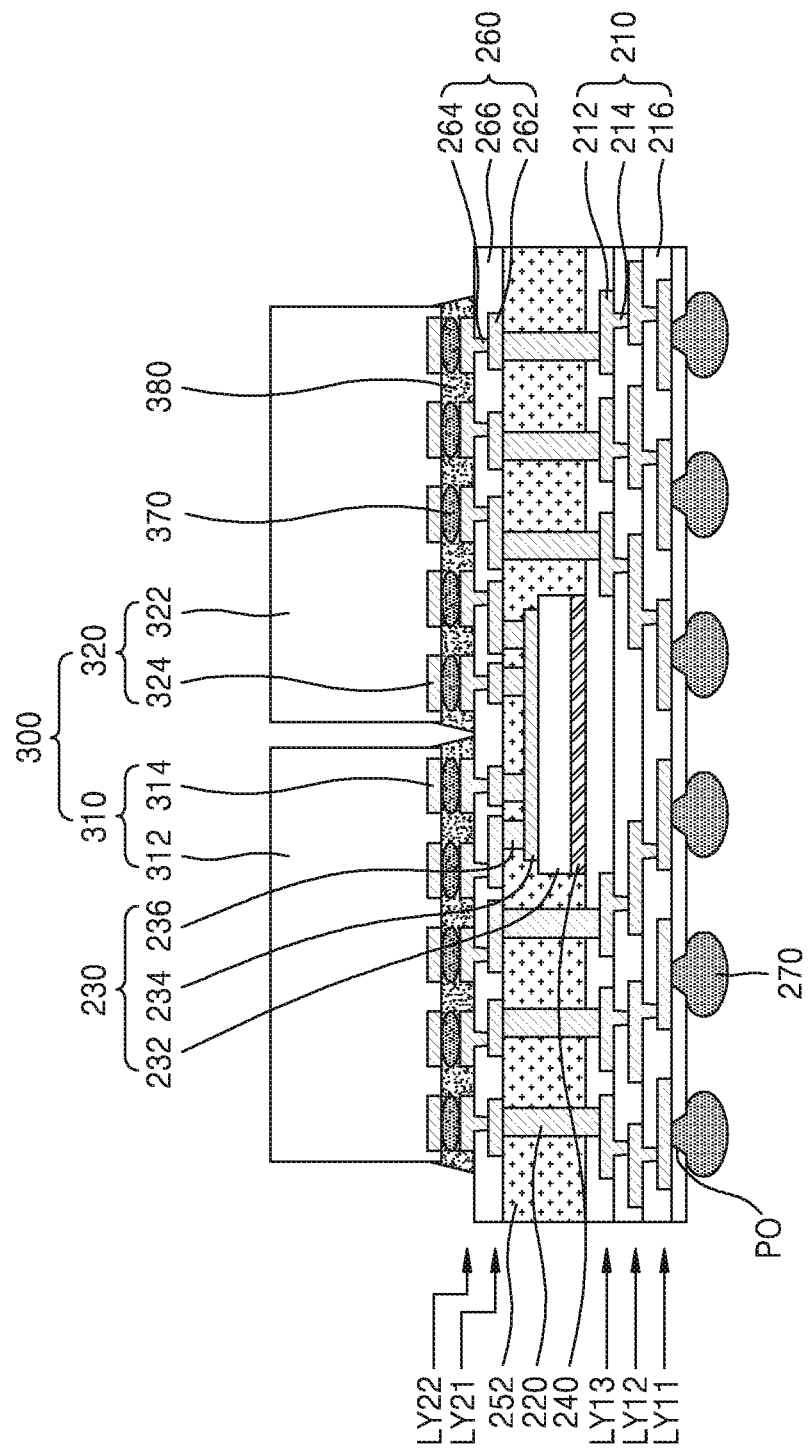

Referring to FIG. 9H, the at least two semiconductor chips 300 is adhered on the upper redistribution line structure 260. The at least two semiconductor chips 300 may include the first semiconductor chip 310 and the second semiconductor chip 320.

The first chip pad 314 of the first semiconductor chip 310 and the second chip pad 324 of the second semiconductor chip 320 may each be connected to the upper redistribution line pattern 262 of the upper redistribution line structure 260 via the chip connection member 370.

The under-fill material layer 380 surrounding the chip connection member 370 may be filled between the upper redistribution line structure 260 and each of the first and second semiconductor chips 310 and 320.

In the semiconductor package if of FIG. 7, the second semiconductor chip 330 of FIG. 7 may be adhered on the upper redistribution line structure 260 instead of the second semiconductor chip 320.

Figure 9I:
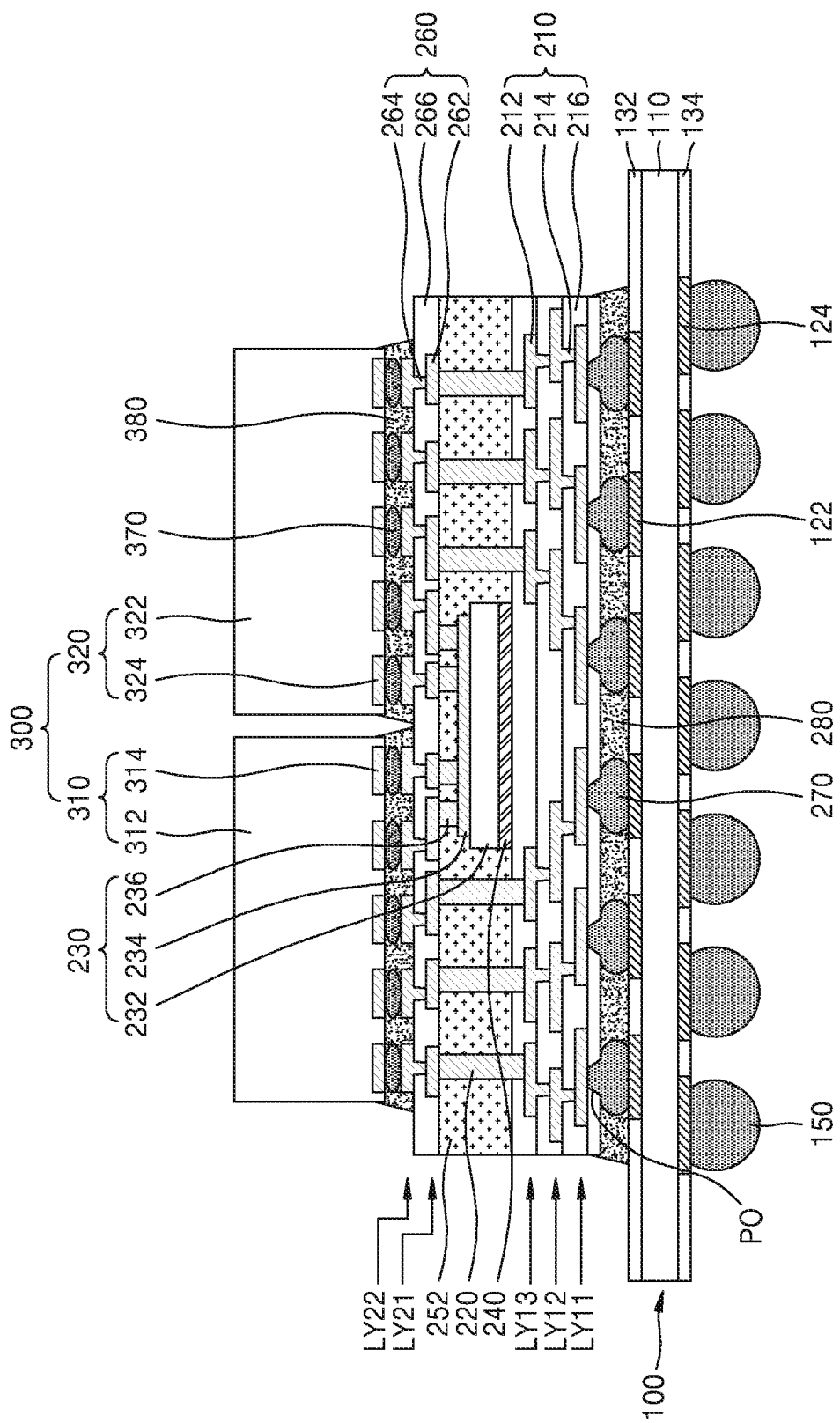

Referring to FIG. 9I, the package base substrate 100 including the base board layer 110 and the upper and lower pads 122 and 124 disposed on the top and bottom surfaces of the base board layer 110, respectively, is prepared, and then a result product of FIG. 9H is adhered on the package base substrate 100 such that the board connection member 270 is connected to the upper pad 122 of the package base substrate 100.

The external connection terminal 150 may be adhered to the lower pad 124 of the package base substrate 100.

Then, as shown in FIG. 1A, the heat emitting member 500 is disposed to contact the top surface of the at least two semiconductor chips 300 to form the semiconductor package 1. According to an embodiment, the semiconductor package 1 may be formed by disposing the heat emitting member 500 to contact the top surface of the package base substrate 100 and surround the at least two semiconductor chips 300.

Figure 10A:
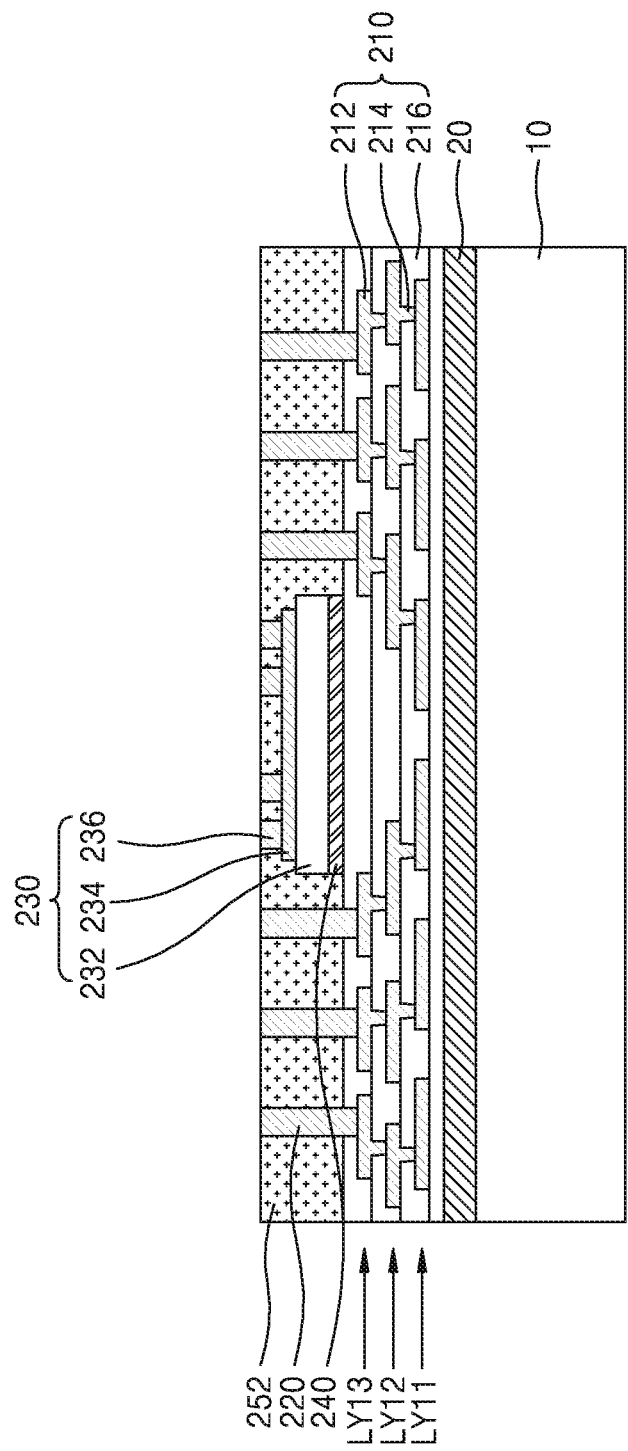
FIGS. 10A through 10G are cross-sectional views for explaining a method of manufacturing a semiconductor package, according to another embodiment.

FIGS. 10A through 10G are cross-sectional views for explaining a method of manufacturing a semiconductor package, according to another embodiment. For example, FIGS. 10A through 10G are cross-sectional views for explaining a method of manufacturing the semiconductor package 1a of FIG. 1, wherein FIG. 10A illustrates a process after FIG. 9D.

Referring to FIG. 10A, the filling insulating layer 252 is formed by removing an upper portion of the filling insulating material layer 250 of FIG. 9D such that the first and second connection pillars 220 and 236 are exposed. The filling insulating layer 252 may cover the top surface of the lower redistribution line structure 210 and the side surface of the first connection pillar 220, and cover the side and top surfaces of the interposer 230 excluding the uppermost portion of the second connection pillar 236. In other words, the filling insulating layer 252 may cover the side surface of each of the first and second connection pillars 220 and 236 while exposing the top surface thereof.

Figure 10B:
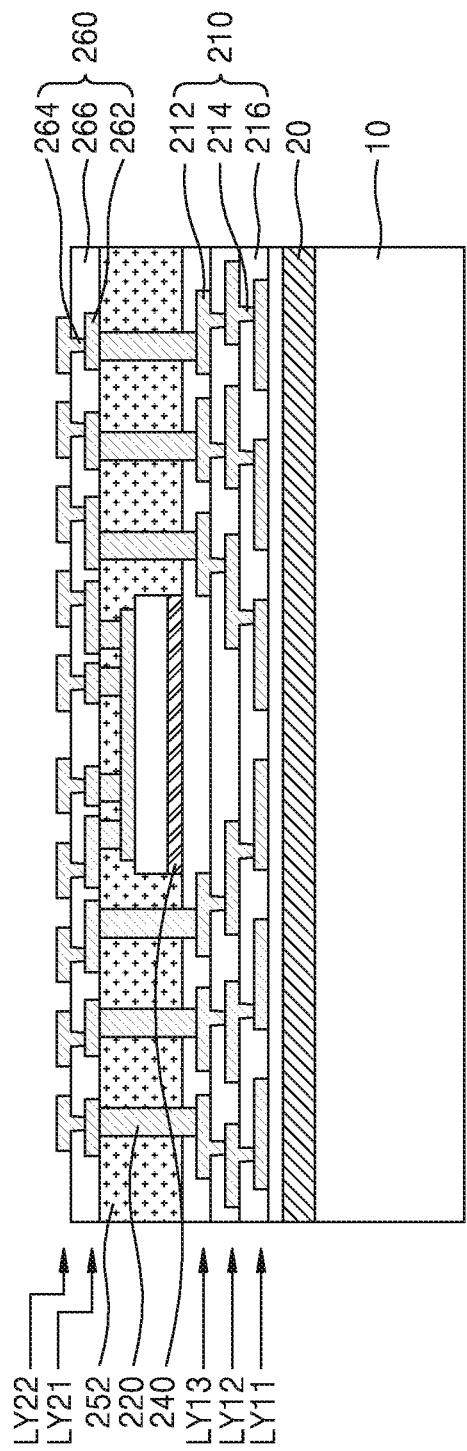

Referring to FIG. 10B, the upper redistribution line structure 260 is formed on the filling insulating layer 252. The upper redistribution line structure 260 may include the at least one upper insulating layer 266, the upper redistribution line pattern 262 disposed on the top or bottom surface of the at least one upper insulating layer 266, and the upper via pattern 264 penetrating the at least one upper insulating layer 266.

The upper redistribution line structure 260 may be formed by sequentially stacking the upper redistribution line pattern 262 or the upper via pattern 264 and the upper redistribution line pattern 262, and the upper insulating layer 266.

For example, a detailed method of manufacturing the upper redistribution line structure 260 is as follows. First, the upper redistribution line pattern 262 forming the layer of the lowermost portion of the upper redistribution line structure 260, for example, the first upper layer LY21, is formed to contact each of the first and second connection pillars 220 and 236. Then, the upper insulating layer 266 exposing a portion of the upper redistribution line pattern 262 including the first upper layer LY21 is formed on the upper redistribution line pattern 262 including the first upper layer LY21, and the upper via pattern 264 including the first upper layer LY21 connected to the upper redistribution line pattern 262 are formed. Here, the upper via pattern 264 and the upper redistribution line pattern 262 may be integrally formed. By repeating such processes, the at least one upper insulating layer 266 and the upper redistribution line structure 260 including a plurality of layers including the first upper layer LY21 and the second upper layer LY22 may be formed.

The number of layers of the upper redistribution line structure 260 may be smaller than the number of layers of the lower redistribution line structure 210. For example, the lower redistribution line structure 210 may include at least three layers and the upper redistribution line structure 260 may include at least two layers that is smaller than that of the lower redistribution line structure 210.

Figure 10C:
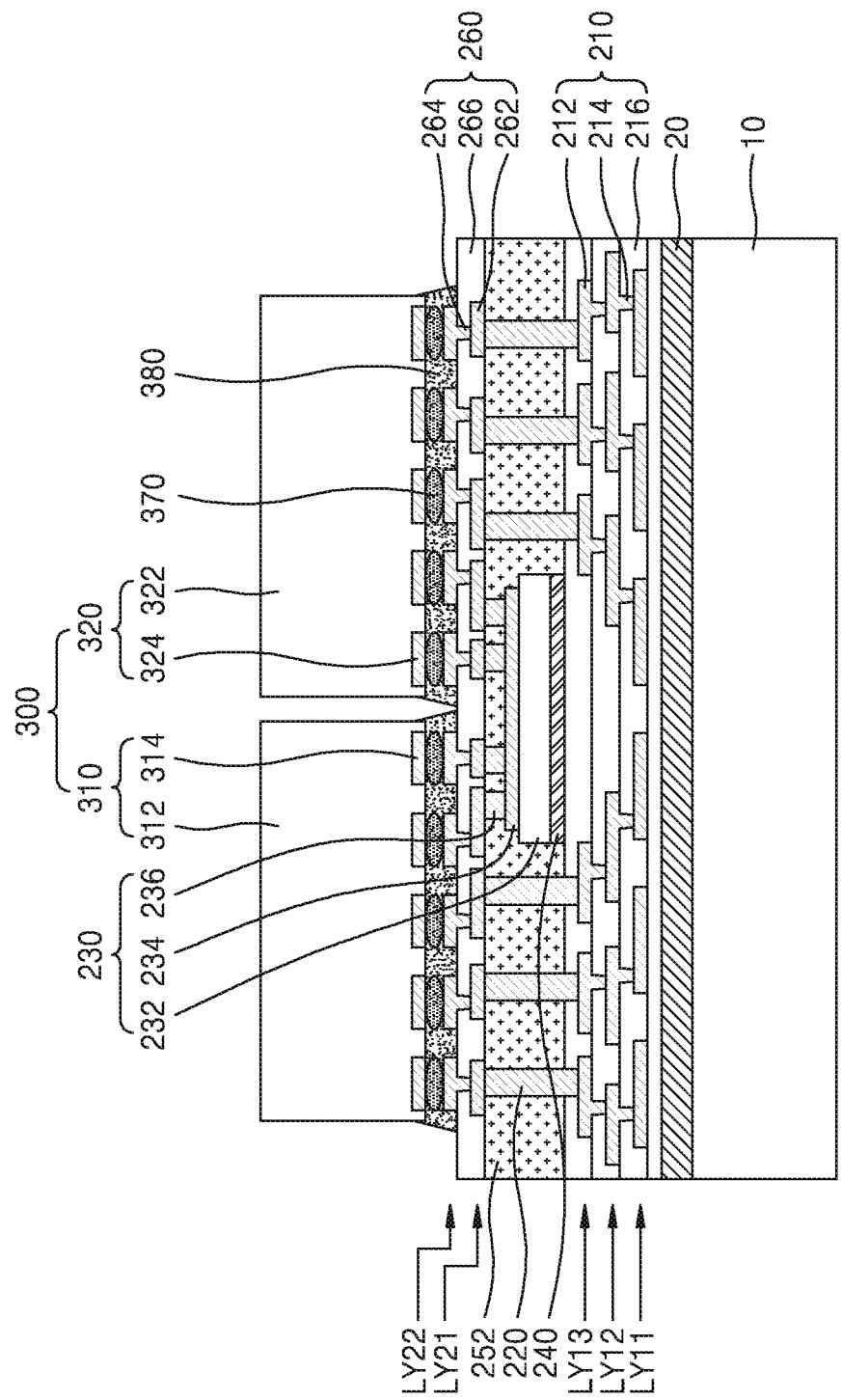

Referring to FIG. 10C, the at least two semiconductor chips 300 are adhered on the upper redistribution line structure 260. The at least two semiconductor chips 300 may include the first semiconductor chip 310 and the second semiconductor chip 320.

The first chip pad 314 of the first semiconductor chip 310 and the second chip pad 324 of the second semiconductor chip 320 may each be connected to the upper redistribution line pattern 262 of the upper redistribution line structure 260 via the chip connection member 370.

The under-fill material layer 380 surrounding the chip connection member 370 may be filled between the upper redistribution line structure 260 and each of the first and second semiconductor chips 310 and 320.

In the semiconductor package 1G of FIG. 8, the second semiconductor chip 330 of FIG. 8 may be adhered on the upper redistribution line structure 260 instead of the second semiconductor chip 320.

Figure 10D:
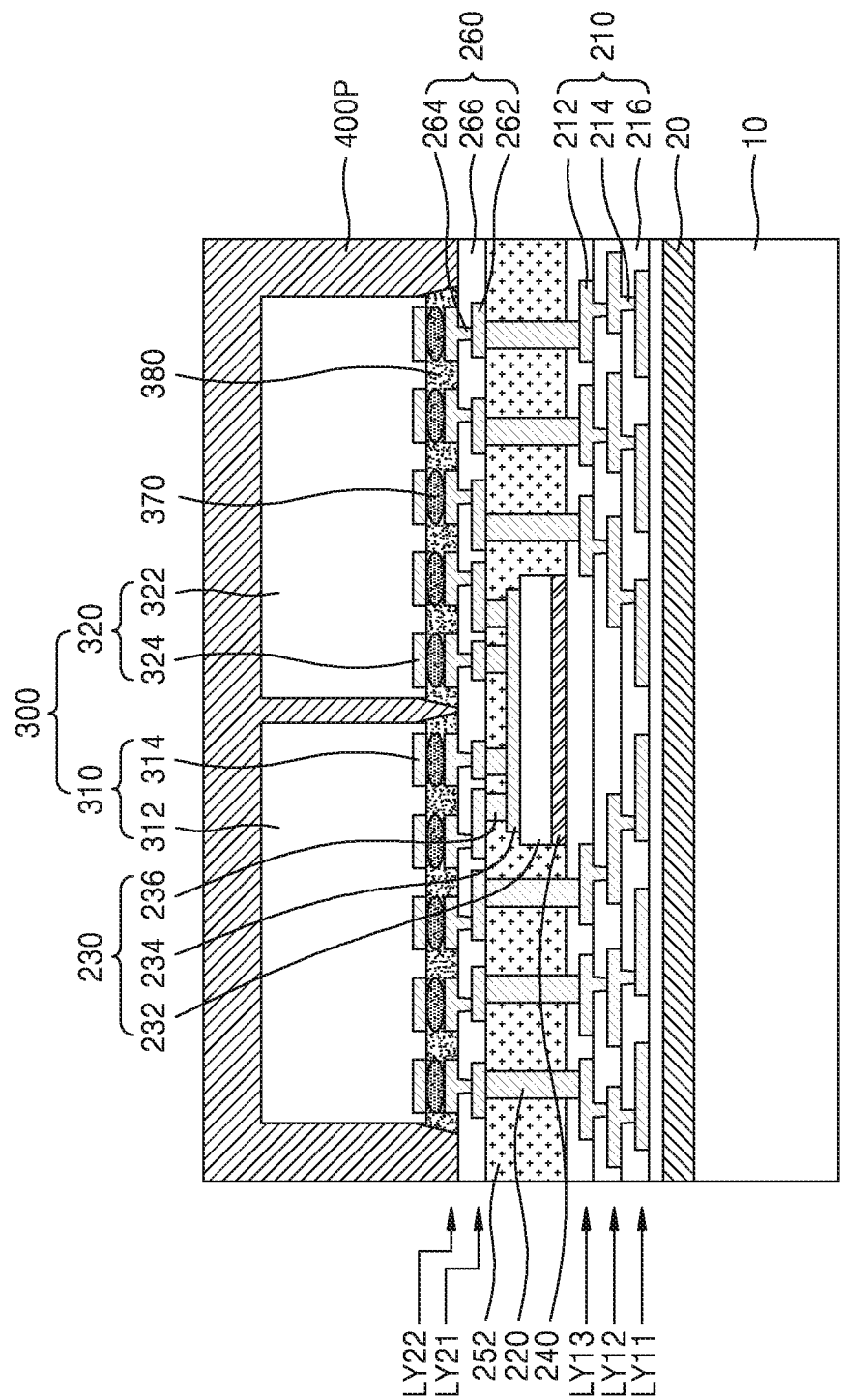

Referring to FIG. 10D, a preliminary molding member 400P surrounding the at least two semiconductor chips 300 on the upper redistribution line structure 260 is formed. The preliminary molding member 400P may be formed of, for example, EMC. The preliminary molding member 400P may surround the top surface of the upper redistribution line structure 260 and the side and top surfaces of the at least two semiconductor chips 300, e.g., the first and second semiconductor chips 310 and 320.

Figure 10E:
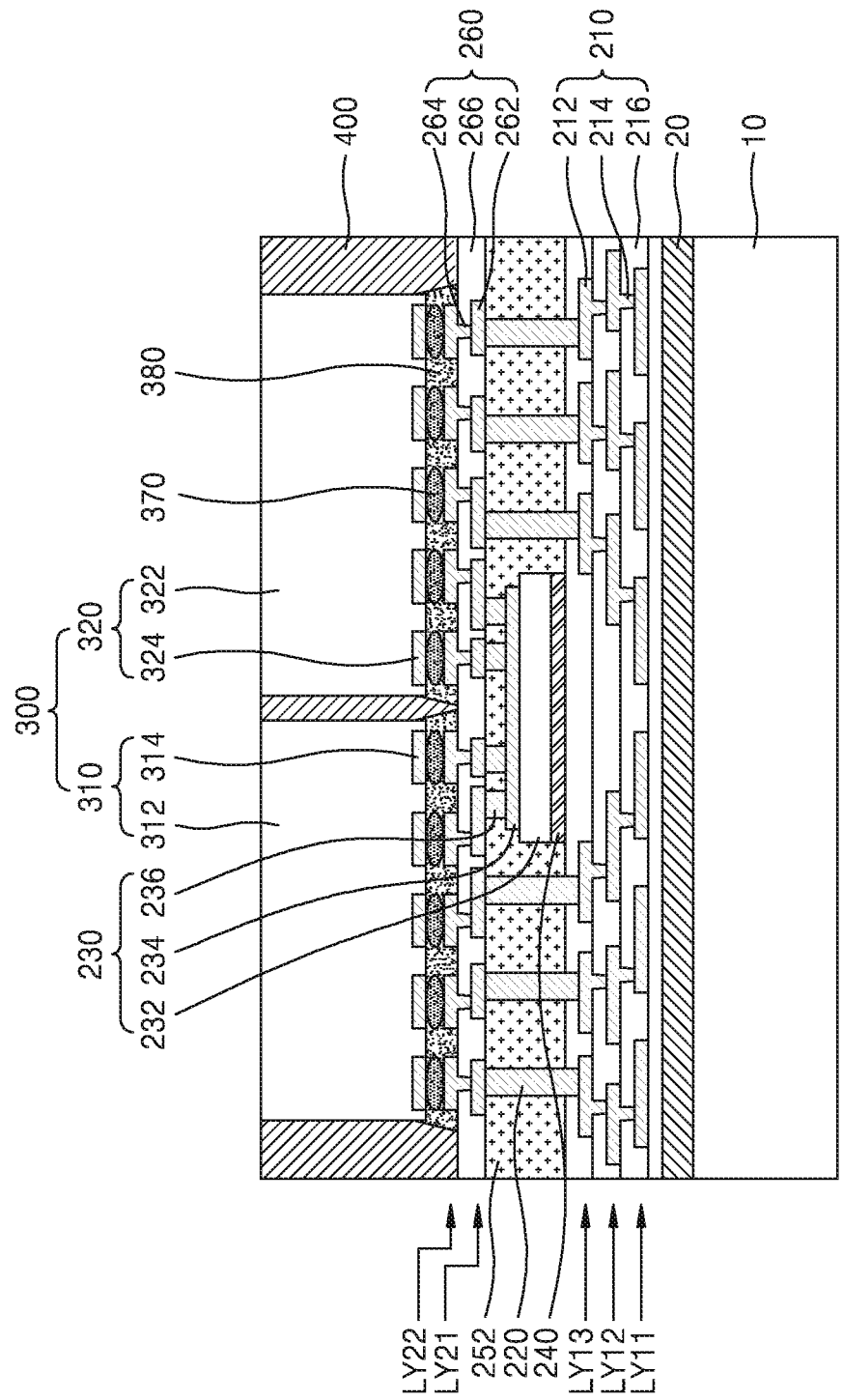

Referring to FIG. 10E, an upper portion of the preliminary molding member 400P of FIG. 10D is removed such that the top surfaces of the at least two semiconductor chips 300, e.g., the first and second semiconductor chips 310 and 320, are exposed, thereby forming the molding member 400. The top surface of the molding member 400 and the top surfaces of the at least two semiconductor chips 300, e.g., the first and second semiconductor chips 310 and 320, may be coplanar. The molding member 400 may surround the top surface of the upper redistribution line structure 260 and the side surfaces of the at least two semiconductor chips 300, e.g., the first and second semiconductor chips 310 and 320.

Figure 10F:
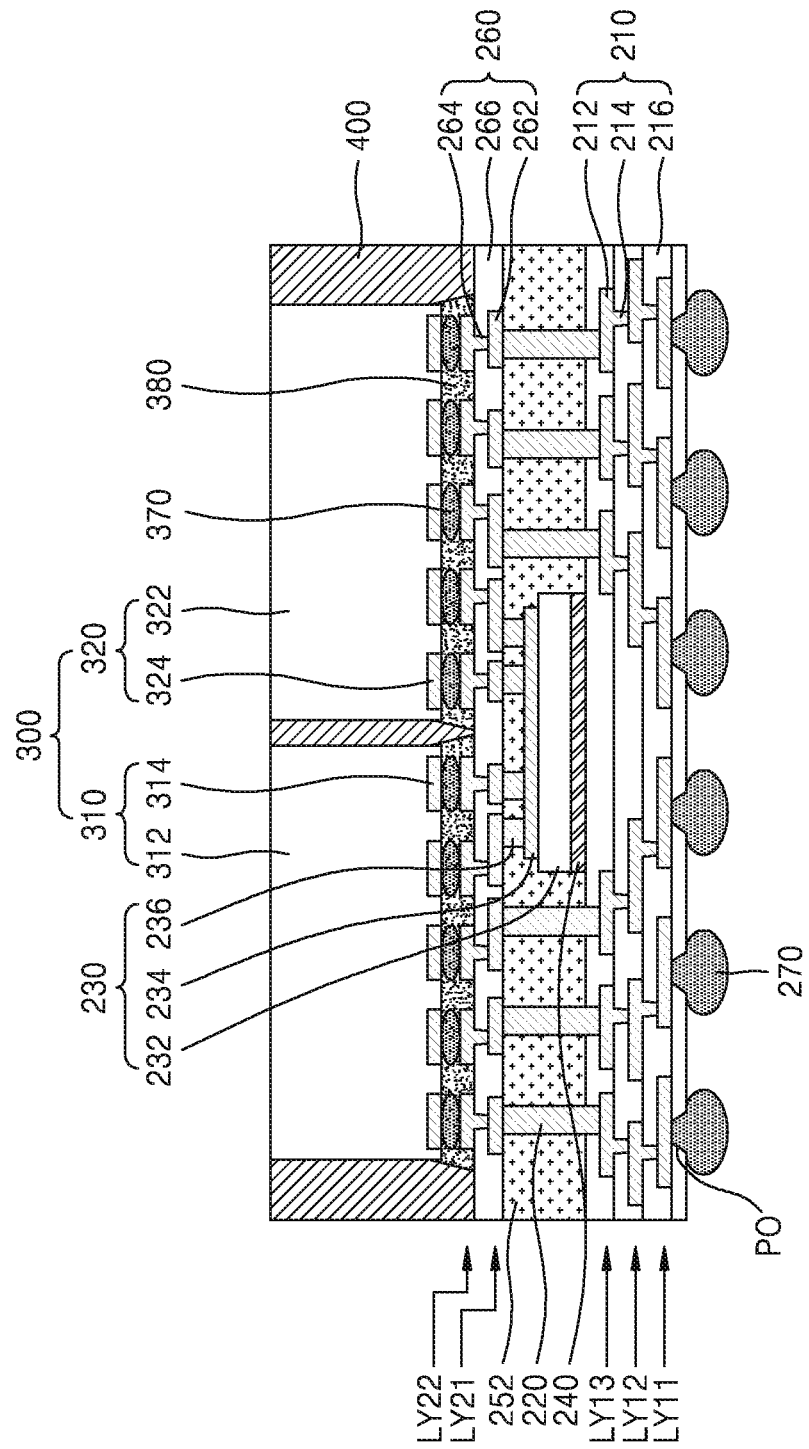

Referring to FIG. 10F, the carrier substrate 10 to which the release film 20 of FIG. 10E is adhered is separated from the lower redistribution line structure 210. Then, a portion of the lower insulating layer 216 of the lowermost layer among the plurality of lower insulating layers 216 is removed to form the pad opening PO that exposes a portion of the lower redistribution line pattern 212 including the first lower layer LY11, and the board connection member 270 contacting the bottom surface of the lower redistribution line pattern 212 including the first lower layer LY11 is adhered through the pad opening PO.

Figure 10G:
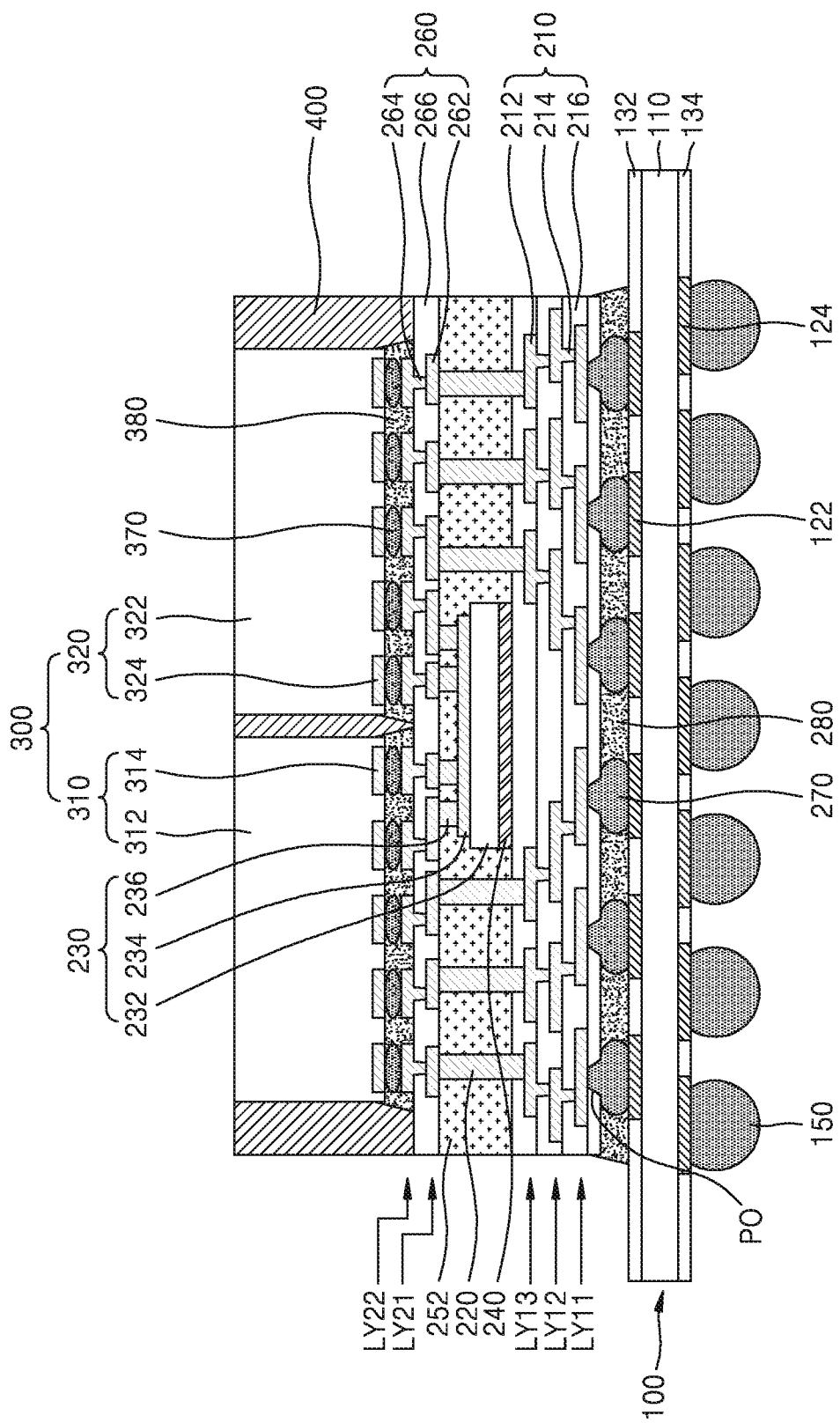

Referring to FIG. 10G, the package base substrate 100 including the base board layer 110 and the upper and lower pads 122 and 124 disposed respectively on the top and bottom surfaces of the base board layer 110 is prepared, and then a result product of FIG. 10F is adhered on the package base substrate 100 such that the board connection member 270 is connected to the upper pad 122 of the package base substrate 100.

The external connection terminal 150 may be adhered to the lower pad 124 of the package base substrate 100.

Then, as shown in FIG. 2, the heat emitting member 500 is disposed to contact the top surface of the at least two semiconductor chips 300 to form the semiconductor package 1a. According to an embodiment, the semiconductor package 1a may be formed by disposing the heat emitting member 500 to contact the top surface of the package base substrate 100 and surround the at least two semiconductor chips 300.

FIGS. 11 through 14 are plan layouts of semiconductor packages 2 through 5 according to embodiments. The semiconductor packages 1 and 1a through if of FIGS. 1A through 8 may be cross-sectional views of all or part of the semiconductor packages 2 through 5 of FIGS. 11 through 14.

Figure 11:
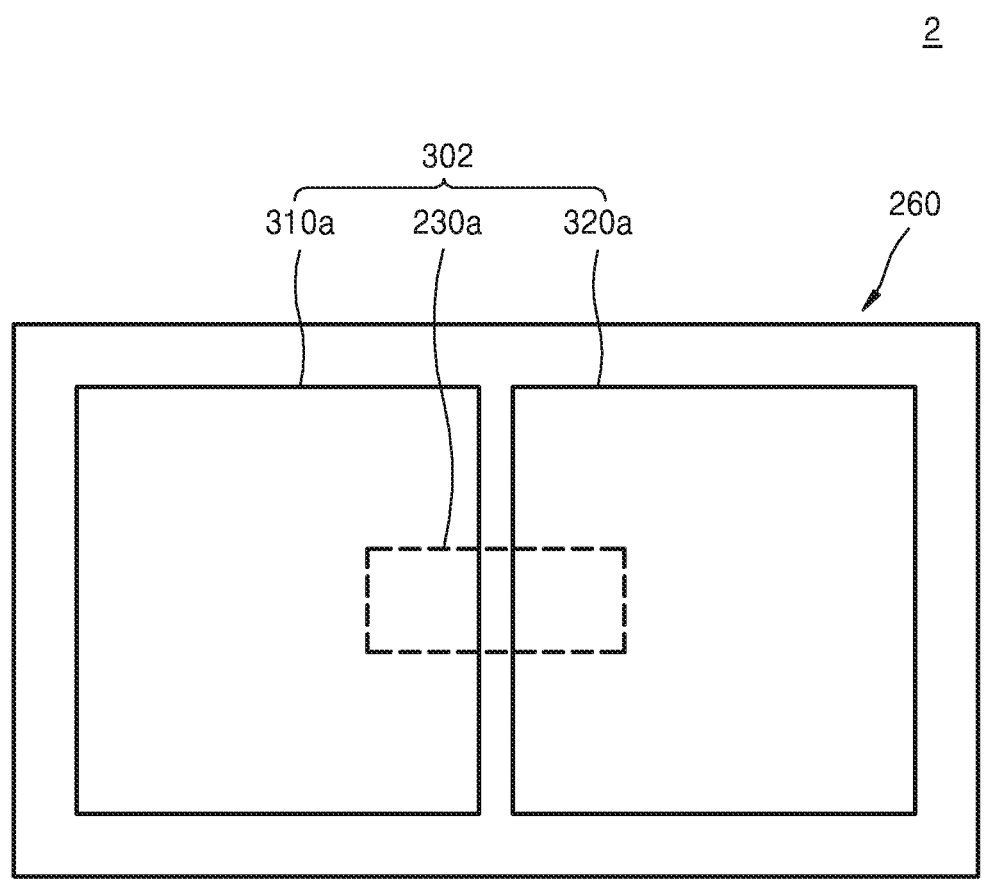
FIGS. 11 through 14 are plan layouts of semiconductor packages according to embodiments.

Referring to FIG. 11, the semiconductor package 2 includes the upper redistribution line structure 260 on an interposer 230a, and at least two semiconductor chips 302 disposed on the upper redistribution line structure 260 and including a first semiconductor chip 310a and a second semiconductor chip 320.

The first and second semiconductor chips 310a and 320a may be disposed on the upper redistribution line structure 260 such as to be spaced apart from each other. A portion of the first semiconductor chip 310a and a portion of the second semiconductor chip 320a may overlap different portions of the interposer 230a.

The first and second semiconductor chips 310a and 320a may be electrically connected to each other via the upper redistribution line structure 260 and the interposer 230a, in the semiconductor package 2.

For example, data transmission and/or reception between the first and second semiconductor chips 310a and 320a and signal transmission for clock synchronization between the first and second semiconductor chips 310a and 320a may be performed only via the upper redistribution line structure 260 and the interposer 230.

In the semiconductor package 2 according to an embodiment, since a signal between the first and second semiconductor chips 310a and 320a is transmitted via the upper redistribution line structure 260 and the interposer 230a, while another signal does not pass through the interposer 230a, a required size of the interposer 230a is relatively small. Accordingly, the semiconductor package 2 may have low manufacturing costs and high yield.

Figure 12:
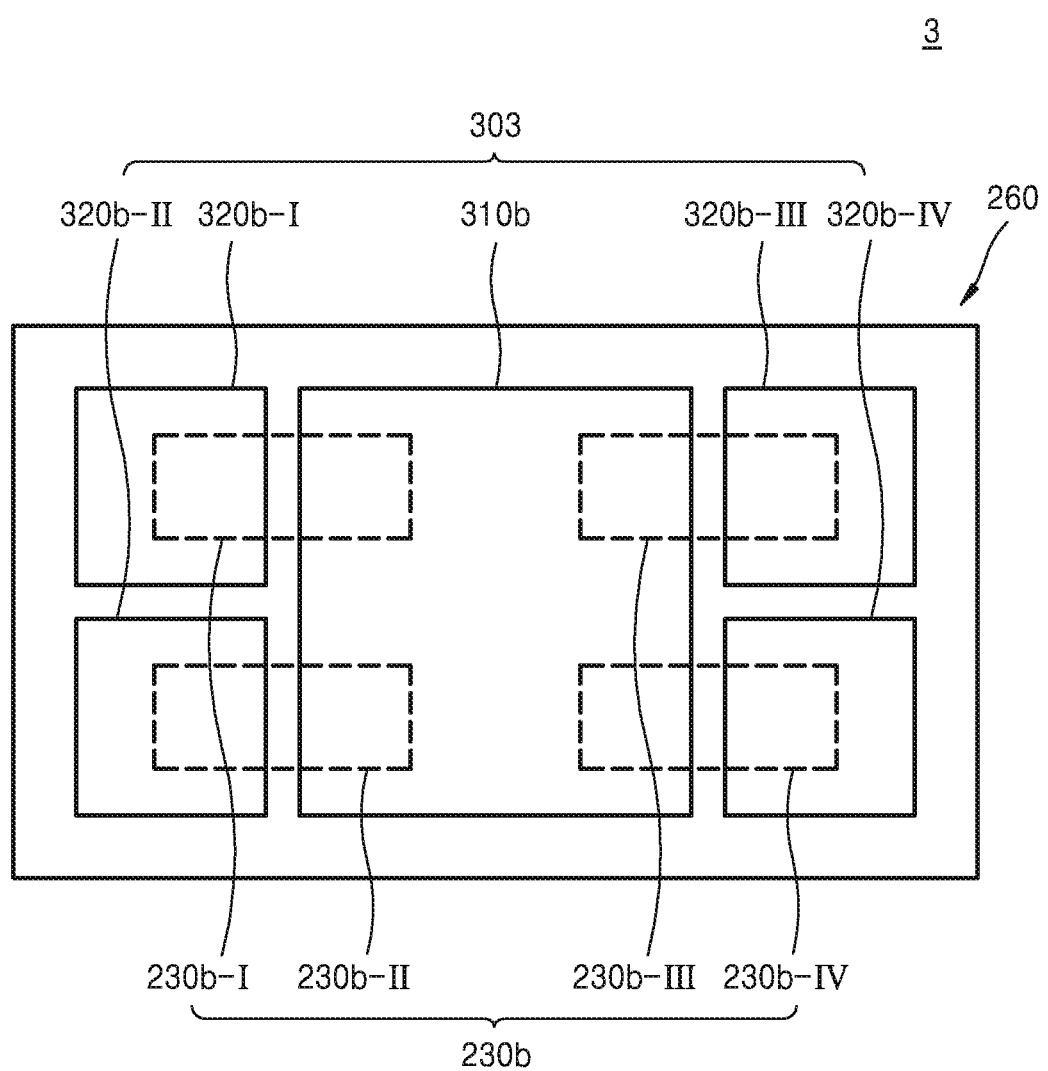

FIG. 12 is a plan layout of the semiconductor package 3 according to an embodiment.

Referring to FIG. 12, the semiconductor package 2 includes the upper redistribution line structure 260 on a plurality of interposers 230b and a plurality of semiconductor chips 303 disposed on the upper redistribution line structure 260. The plurality of semiconductor chips 303 may be disposed on the upper redistribution line structure 260 while being spaced apart from each other. The plurality of semiconductor chips 303 may include a main semiconductor chip 310b, a first sub-semiconductor chip 320b-I, a second sub-semiconductor chip 320b-II, a third sub-semiconductor chip 320b-III, and a fourth sub-semiconductor chip 320b-IV.

The plurality of interposers 230b may be spaced apart from each other. The plurality of interposers 230b may include a first sub-interposer 230b-I, a second sub-interposer 230b-II, a third sub-interposer 230b-III, and a fourth sub-interposer 230b-IV.

Different portions of the main semiconductor chip 310b may respectively overlap portions of the plurality of interposers 230b. Portions of the first through fourth sub-semiconductor chips 320b-I through 320b-IV may respectively overlap portions of the first through fourth sub-interposers 230b-I through 230b-IV.

In FIG. 12, the plurality of semiconductor chips 303 include one main semiconductor chip 310b and four surrounding sub-semiconductor chips, e.g., the first through fourth sub-semiconductor chips 320b-I through 32b-IV, but alternatively, the plurality of semiconductor chips 303 may include one main semiconductor chip 310b and at least two surrounding sub-semiconductor chips. The number of interposers 230b may be equal to or an integer multiple of the number of sub-semiconductor chips included in the plurality of semiconductor chips 303.

The main semiconductor chip 310b and the first through fourth sub-semiconductor chips 320b-I through 320b-IV may be electrically connected to each other in the semiconductor package 3 via the upper redistribution line structure 260 and the first through fourth sub-interposers 230b-I through 230b-IV.

In the semiconductor package 3 according to an embodiment, since a signal between the main semiconductor chip 310b and each of the first through fourth sub-semiconductor chips 320b-I through 320b-IV is transmitted via the upper redistribution line structure 260 and the first through fourth sub-interposers 230b-I through 230b-IV that are spaced apart from each other, while another signal does not pass through the plurality of interposers 230b, a required size of the plurality of interposers 230b is relatively small. Accordingly, the semiconductor package 3 may have low manufacturing costs and high yield.

Figure 13:
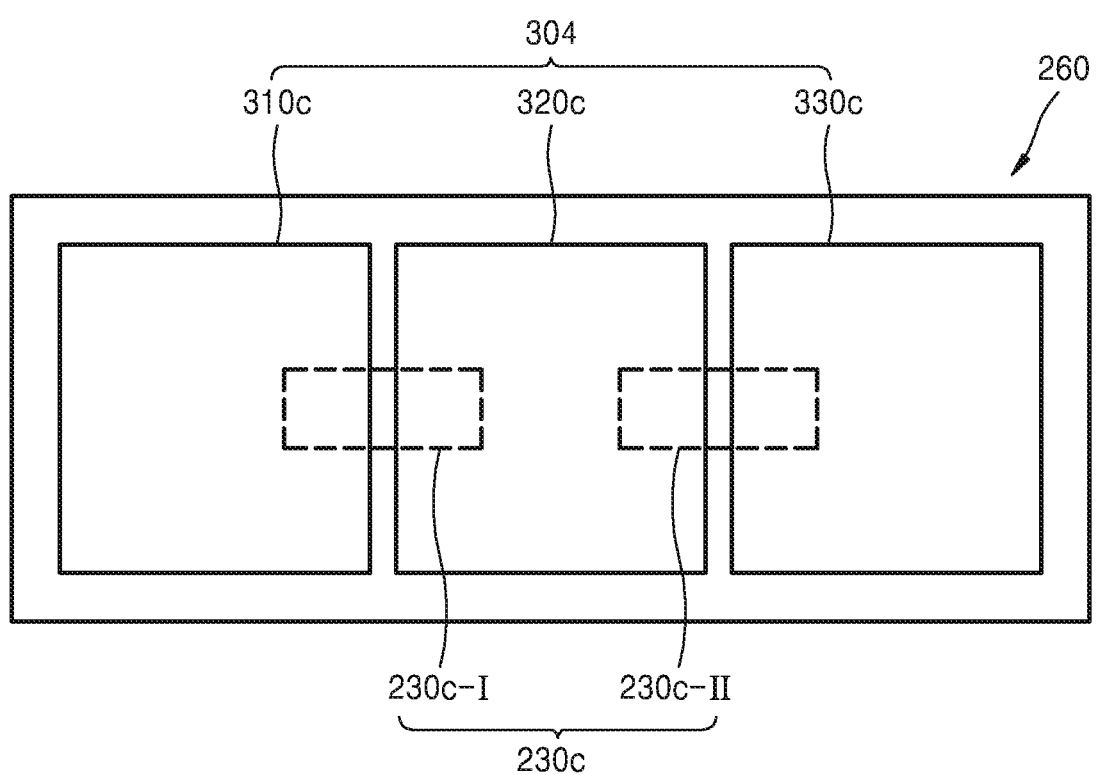

FIG. 13 is a plan layout of the semiconductor package 4 according to another embodiment.

Referring to FIG. 13, the semiconductor package 4 includes the upper redistribution line structure 260 on a plurality of interposers 230c spaced apart from each other, and a plurality of semiconductor chips 304 on the upper redistribution line structure 260, the semiconductor chips 304 including first through third semiconductor chips 310c through 330c. The plurality of interposers 230c may include a first sub-interposer 230c-I and a second sub-interposer 230c-II.

The first through third semiconductor chips 310c through 330c may be disposed on the upper redistribution line structure 260 while being spaced apart from each other. A portion of the first semiconductor chip 310c and a portion of the second semiconductor chip 320c may respectively overlap different portions of the first sub-interposer 230c-I, and another portion of the second semiconductor chip 320c and a portion of the third semiconductor chip 330c may respectively overlap different portions of the second sub-interposer 230c-II.

In the semiconductor package 4, the first and second semiconductor chips 310c and 320c may be electrically connected to each other via the upper redistribution line structure 260 and the first sub-interposer 230c-I, and the second and third semiconductor chips 320c and 330c may be electrically connected to each other via the upper redistribution line structure 260 and the second sub-interposer 230c-II.

In the semiconductor package 4 according to an embodiment, since a signal between the first and second semiconductor chips 310c and 320c and a signal between the second and third semiconductor chips 320c and 330c are transmitted via the upper redistribution line structure 260 and the plurality of interposers 230c spaced apart from each other, while another signal does not pass through the plurality of interposers 230c, a required size of the plurality of interposers 230c is relatively small. Accordingly, the semiconductor package 4 may have low manufacturing costs and high yield.

Figure 14:
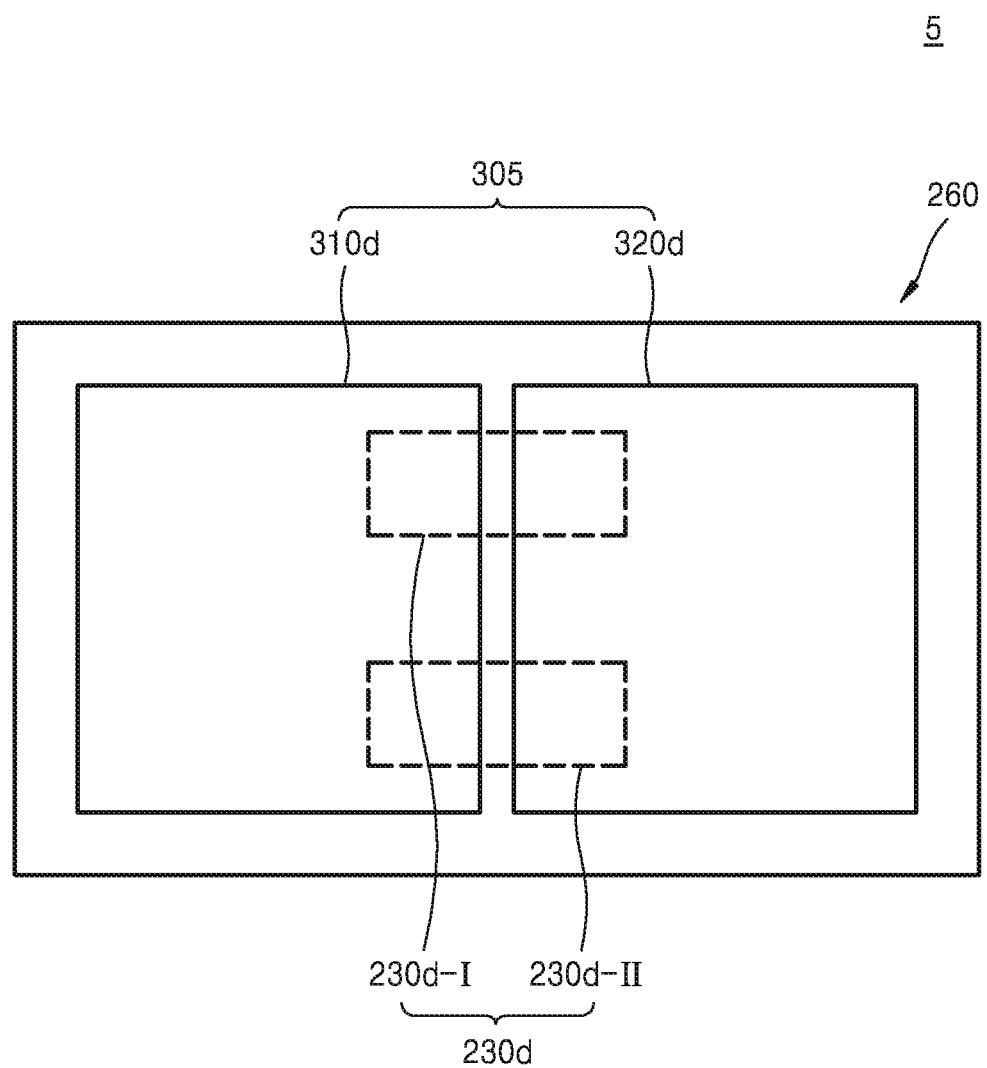

FIG. 14 is a plan layout of the semiconductor package 5 according to another embodiment.

Referring to FIG. 14, the semiconductor package 5 includes the upper redistribution line structure 260 on a plurality of interposers 230d spaced apart from each other, and at least two semiconductor chips 305 disposed on the upper redistribution line structure 260 and including a first semiconductor chip 310d and a second semiconductor chip 320d. The plurality of interposers 230 may include a first sub-interposer 230d-I and a second sub-interposer 230d-II.

The first and second semiconductor chips 310d and 320d may be disposed on the upper redistribution line structure 260 while being spaced apart from each other. Different portions of the first semiconductor chip 310d and different portions of the second semiconductor chip 320d may respectively overlap different portions of the plurality of interposers 230. For example, the different portions of the first semiconductor chip 310d may respectively overlap a portion of the first sub-interposer 230d-I and a portion of the second sub-interposer 230d-II, and the different portions of the second semiconductor chip 320d may respectively overlap another portion of the first sub-interposer 230d-I and another portion of the second sub-interposer 230d-II.

In the semiconductor package 5, the first and second semiconductor chips 310d and 320d may be electrically connected to each other via the upper redistribution line structure 260 and the first sub-interposer 230d-I and via the upper redistribution line structure 260 and the second sub-interposer 230d-II.

In the semiconductor package 5 according to an embodiment, since a signal between the first and second semiconductor chips 310d and 320d is transmitted via the upper redistribution line structure 260 and the plurality of interposers 230d, while another signal does not pass through the plurality of interposers 230d. Also, since the plurality of interposers 230d include the first and second sub-interposers 230d-I and 230d-II that are spaced apart from each other, a required size of the plurality of interposers 230d is relatively small. Also, since the signal between the first and second semiconductor chips 310d and 320d is divided and transmitted via the first and second sub-interposers 230d-I and 230d-II that are spaced apart from each other, a degree of freedom of design for a chip pad (for example, the first and second chip pads 314 and 324 of FIG. 1A) for signal transmission of each of the first and second semiconductor chips 310d and 320d may be increased. Accordingly, the semiconductor package 5 may have low manufacturing costs and high yield.

While the inventive concepts have been particularly shown and described with reference to embodiments thereof, it will be understood that various changes in form and details may be made therein without departing from the spirit and scope of the following claims.

What is claimed is:

1. A semiconductor package comprising:
   a lower redistribution line structure comprising a plurality of lower insulating layers and a plurality of lower redistribution line patterns respectively on at least one of top surfaces and bottom surfaces of the plurality of lower insulating layers;
   a plurality of first connection pillars on at least portions of the plurality of lower redistribution line patterns, respectively;
   an interposer apart from the plurality of first connection pillars on the lower redistribution line structure and comprising an interposer substrate, a plurality of connection wiring patterns on a top surface of the interposer substrate, and a plurality of second connection pillars on at least portions adjacent to two ends of the plurality of connection wiring patterns, respectively;
   an upper redistribution line structure comprising at least one upper insulating layer and a plurality of upper redistribution line patterns on a top surface or a bottom surface of the at least one upper insulating layer and connected to the plurality of first connection pillars and the plurality of second connection pillars, respectively; and
   at least two semiconductor chips on the upper redistribution line structure, electrically connected to the plurality of upper redistribution line patterns, and apart from each other.

2. The semiconductor package of claim 1, wherein the lower redistribution line structure and the upper redistribution line structure each comprise a plurality of layers including circuit wires where the plurality of lower redistribution line patterns and the plurality of upper redistribution line patterns are, wherein a number of layers included in the upper redistribution line structure is less than a number of layers included in the lower redistribution line structure.

3. The semiconductor package of claim 1, wherein a height of the plurality of first connection pillars is greater than a height of the plurality of second connection pillars.

4. The semiconductor package of claim 1, wherein a height of the plurality of first connection pillars is greater than a height of the interposer.

5. The semiconductor package of claim 1, wherein an uppermost portion of the plurality of first connection pillars and an uppermost portion of the plurality of second connection pillars are on a same level.

6. The semiconductor package of claim 1, wherein a lowermost portion of the plurality of first connection pillars is at a level lower than a bottom surface of the interposer.

7. The semiconductor package of claim 1, further comprising a filling insulating layer surrounding the plurality of first connection pillars and the interposer between the lower redistribution line structure and the upper redistribution line structure.

8. The semiconductor package of claim 7, wherein an uppermost portion of the plurality of first connection pillars, an uppermost portion of the plurality of second connection pillars, and a top surface of the filling insulating layer are coplanar.

9. A semiconductor package comprising:
a package base substrate;
a lower redistribution line structure on the package base substrate and comprising a plurality of lower redistribution line patterns;
at least one interposer and a plurality of first connection pillars apart from each other on the lower redistribution line structure, the at least one interposer comprising a plurality of connection wiring patterns and a plurality of second connection pillars on at least portions adjacent to two ends of the plurality of connection wiring patterns, respectively, and the plurality of first connection pillars being connected to portions of the plurality of lower redistribution line patterns;
an upper redistribution line structure comprising a plurality of upper redistribution line patterns connected to the plurality of first connection pillars and the plurality of connection wiring patterns, respectively, on the plurality of first connection pillars and the at least one interposer; and
at least two semiconductor chips on the upper redistribution line structure apart from each other and electrically connected to the plurality of upper redistribution line patterns.

10. The semiconductor package of claim 9, configured to transmit signals between the at least two semiconductor chips via the upper redistribution line structure and the at least one interposer, and
configured to transmit signals between the at least two semiconductor chips and the package base substrate via the upper redistribution line structure, the plurality of first connection pillars, and the lower redistribution line structure.

11. The semiconductor package of claim 9, wherein a minimum pitch of the plurality of upper redistribution line patterns is greater than a minimum pitch of the plurality of connection wiring patterns.

12. The semiconductor package of claim 9, wherein a width and a thickness of the plurality of upper redistribution line patterns are greater than a width and a thickness of the plurality of connection wiring patterns.

13. The semiconductor package of claim 9, wherein the at least two semiconductor chips comprise a main semiconductor chip and a plurality of sub-semiconductor chips,
wherein the at least one interposer comprises a plurality of sub-interposers that overlap a portion of the main semiconductor chip and a portion of each of the plurality of sub-semiconductor chips to electrically interconnect the main semiconductor chip to each of the plurality of sub-semiconductor chips.

14. The semiconductor package of claim 9, wherein the at least two semiconductor chips comprise a first semiconductor chip, a second semiconductor chip, and a third semiconductor chip,
wherein the at least one interposer comprises a first sub-interposer that overlaps a portion of the first semiconductor chip and a portion of the second semiconductor chip to electrically connect the first semiconductor chip to the second semiconductor chip, and a second sub-interposer that overlaps another portion of the second semiconductor chip and a portion of the third semiconductor chip to electrically connect the second semiconductor chip to the third semiconductor chip.

15. The semiconductor package of claim 9, further comprising a heat emitting member contacting a top surface of the at least two semiconductor chips.

16. The semiconductor package of claim 15, wherein the heat emitting member surrounds the at least two semiconductor chips by contacting a top surface of the package base substrate.

17. The semiconductor package of claim 9, wherein the at least two semiconductor chips comprise a first semiconductor chip and a second semiconductor chip,
wherein the at least one interposer each comprises a first sub-interposer that overlaps a portion of the first semiconductor chip and a portion of the second semiconductor chip to electrically connect the first semiconductor chip to the second semiconductor chip, and a second sub-interposer that overlaps the other portion of the first semiconductor chip and the other portion of the second semiconductor chip.

18. A semiconductor package comprising:
a lower redistribution line structure comprising a plurality of lower redistribution line patterns;
a plurality of first connection pillars connected to the plurality of lower redistribution line patterns;
an interposer on the lower redistribution line structure, the interposer comprising an interposer substrate, a plurality of connection wiring patterns on the interposer substrate, and a plurality of second connection pillars on at least portions adjacent to two ends some of the plurality of connection wiring patterns;
an upper redistribution line structure comprising a plurality of upper redistribution line patterns electrically connected to the plurality of first connection pillars and the plurality of second connection pillars, on the plurality of first connection pillars and the interposer; and
at least two semiconductor chips on the upper redistribution line structure and electrically connected to the plurality of upper redistribution line patterns,
wherein a portion of the plurality of upper redistribution line patterns and a portion of the plurality of lower redistribution line patterns extend beyond a footprint occupied by the at least two semiconductor chips in a horizontal direction.

19. The semiconductor package of claim 18, further comprising a passive device connected to a portion of the plurality of redistribution line patterns on the lower redistribution line structure.

20. The semiconductor package of claim 18, wherein the interposer further comprises a through electrode interconnecting some others of the plurality of connection wiring patterns to the plurality of lower redistribution line patterns by penetrating the interposer substrate.

* * * * *